(12) United States Patent
Kim et al.

(10) Patent No.: US 11,900,015 B2
(45) Date of Patent: Feb. 13, 2024

(54) ELECTRONIC DEVICE AND METHOD FOR CONTROLLING AUDIO VOLUME THEREOF

(71) Applicant: Samsung Electronics Co., Ltd., Suwon-si (KR)

(72) Inventors: Bongkyu Kim, Suwon-si (KR); Jinbong Ryu, Suwon-si (KR); Jongmoon Park, Suwon-si (KR); Myeongseok Lee, Suwon-si (KR); Sanghun Lee, Suwon-si (KR); Saetbyeol Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 185 days.

(21) Appl. No.: 17/386,819

(22) Filed: Jul. 28, 2021

(65) Prior Publication Data
US 2022/0035594 A1     Feb. 3, 2022

(30) Foreign Application Priority Data
Jul. 28, 2020   (KR) .................. 10-2020-0094021

(51) Int. Cl.
  *G06F 3/16*     (2006.01)
  *H04R 1/10*     (2006.01)
  *H04W 4/80*     (2018.01)

(52) U.S. Cl.
  CPC .............. *G06F 3/165* (2013.01); *G06F 3/162* (2013.01); *H04R 1/1041* (2013.01);
(Continued)

(58) Field of Classification Search
None
See application file for complete search history.

(56) References Cited

U.S. PATENT DOCUMENTS 9,379,683 B2   6/2016   Marino et al.
9,766,853 B2   9/2017   Kallai et al.
(Continued)

FOREIGN PATENT DOCUMENTS

CN   106453838 A  *  2/2017 ............ G06F 3/165
EP   3 490 262 A1    5/2019
(Continued)

OTHER PUBLICATIONS

International Search Report dated Oct. 27, 2021, issued in International Patent Application No. PCT/KR2021/009757.
(Continued)

*Primary Examiner* — Walter F Briney, III
(74) *Attorney, Agent, or Firm* — Jefferson IP Law, LLP

(57) ABSTRACT

An electronic device is provided. The electronic device includes a display, communication circuitry, and a processor operatively connected to the display and the communication circuitry, wherein the processor is configured to transmit audio data to an external device through the communication circuitry, receive a user input for adjustment of a volume level of an audio output through the external device, in response to the user input, check whether a first volume level being set in the electronic device is within a specified range, select one of the first volume level of the electronic device or a second volume level of the external device to be adjusted corresponding to the user input based on whether the first volume level being set in the electronic device is within the specified range, display a volume panel UI comprising the selected one of the first volume level or the second volume level and a graphic object indicating the one of the electronic device or the external device, when adjusting the selected one of the first volume level or the second volume level, and change the graphic object indicating the selected one of the electronic device or the external device (Continued)

to a graphic object indicating other of the electronic device or the external device and switch the selected one of the first volume level or the second volume level to other of the first volume level or the second volume level to be adjusted corresponding to the user input, when adjusting the other of the first volume level or the second volume level while displaying the volume panel UI.

20 Claims, 18 Drawing Sheets

(52) U.S. Cl.
CPC ...... *H04R 2420/07* (2013.01); *H04R 2430/01* (2013.01); *H04W 4/80* (2018.02)

(56) References Cited

U.S. PATENT DOCUMENTS

| | | | |
|---|---|---|---|
| 9,851,937 B2 | 12/2017 | Jang | |
| 2012/0051560 A1 | 3/2012 | Sanders | |
| 2012/0110452 A1* | 5/2012 | Hiipakka | G06F 3/165 |
| | | | 715/716 |
| 2014/0162625 A1 | 6/2014 | Zhao et al. | |
| 2015/0293744 A1* | 10/2015 | Bae | H04N 5/60 |
| | | | 381/105 |
| 2017/0185373 A1 | 6/2017 | Kim et al. | |
| 2017/0322713 A1 | 11/2017 | Hwang et al. | |
| 2019/0158926 A1 | 5/2019 | Kang et al. | |
| 2021/0034222 A1* | 2/2021 | Brems | G06T 19/006 |
| 2021/0240434 A1 | 8/2021 | Kim et al. | |

FOREIGN PATENT DOCUMENTS

| | | |
|---|---|---|
| KR | 10-2007-0110583 A | 11/2007 |
| KR | 10-2015-0095124 A | 8/2015 |
| KR | 10-2015-0117862 A | 10/2015 |
| KR | 10-2015-0121565 A | 10/2015 |
| KR | 10-2017-0076357 A | 7/2017 |
| KR | 10-2017-0124933 A | 11/2017 |
| KR | 10-2020-0007378 A | 1/2020 |
| WO | 2013/023344 A1 | 2/2013 |

OTHER PUBLICATIONS

Extended European Search Report dated Sep. 11, 2023, issued in European Patent Application No. 21851506.2.

* cited by examiner

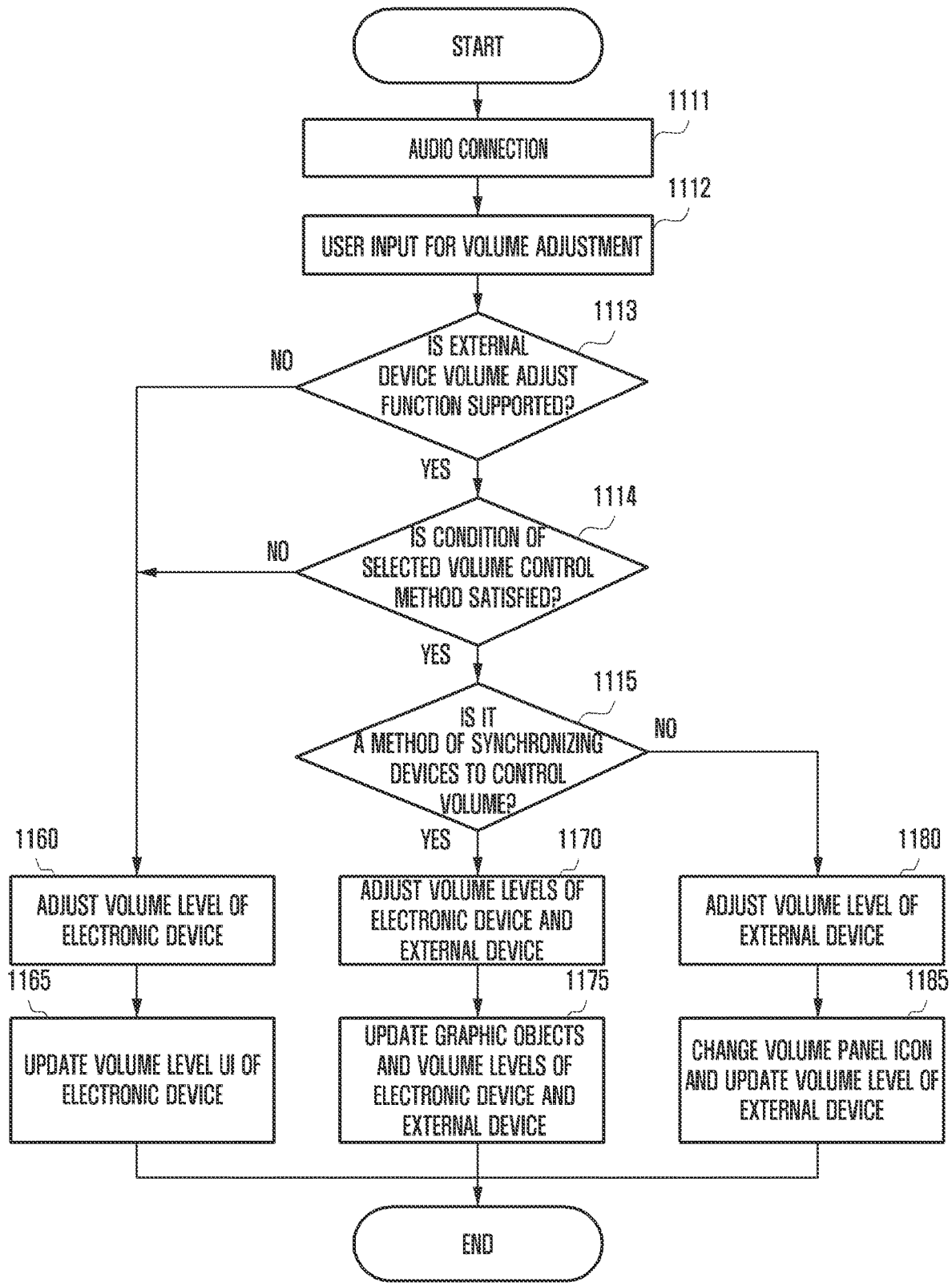

ELECTRONIC DEVICE AND METHOD FOR CONTROLLING AUDIO VOLUME THEREOF

CROSS-REFERENCE TO RELATED APPLICATION(S)

This application is based on and claims priority under 35 U.S.C. § 119(a) of a Korean patent application number 10-2020-0094021, filed on Jul. 28, 2020, in the Korean Intellectual Property Office, the disclosure of which is incorporated by reference herein in its entirety.

BACKGROUND

1. Field

The disclosure relates to an electronic device. More particularly, the disclosure relates to an electronic device capable of outputting audio data through an external device connected through short-range wireless communication and a method for controlling the audio volume thereof according to a user input on the electronic device.

2. Description of Related Art

In line with development of telecommunication technology and processor technology, portable electronic devices epitomized by smartphones (hereinafter, referred to as electronic devices) are equipped with various functions. Electronic devices can provide user experiences through various applications, and can provide multimedia experiences in various types.

An electronic device may transmit video and/or audio data to an external device through short-range wireless communication, thereby outputting data in real time. For example, an electronic device may output audio data by using a sound output device (for example, a speaker or an earphone) wirelessly connected thereto, and may output video and audio data to an external device (for example, a TV) by using a screen mirroring function.

When outputting audio data, an electronic device may provide a volume adjustment function according to a user input. Such a volume adjustment function may also be provided when audio data is output by an external device.

The above information is presented as background information only to assist with an understanding of the disclosure. No determination has been made, and no assertion is made, as to whether any of the above might be applicable as prior art with regard to the disclosure.

SUMMARY

When the user of an electronic device makes an input to increase or decrease the volume, the volume of audio data provided by the electronic device and/or the volume of the external data may be increased or decreased.

Various technologies have drawbacks in that, in connection with adjusting the volume according to a user input, it is difficult for the user to recognize, among the electronic device and the external device, the volume of which device is to be adjusted, and even if the user has recognized the same, he/she has to select the specific device and to adjust the volume manually. In addition, if the electronic device is disconnected from the external device after the volume of the external device is adjusted according to a user input, the volume level configured for the external device may be too high or too low contrary to the user's intent, and this may cause a problem (for example, an ear shock).

Aspects of the disclosure are to address at least the above-mentioned problems and/or disadvantages and to provide at least the advantages described below. Accordingly, an aspect of the disclosure is to provide an electronic device capable of appropriately selecting a device, the volume of which is to be adjusted in response to a user input for volume adjustment, and a method for controlling the audio volume thereof.

Additional aspects will be set forth in part in the description which follows and, in part, will be apparent from the description, or may be learned by practice of the presented embodiments.

In accordance with an aspect of the disclosure, an electronic device is provided. The electronic device includes a display, communication circuitry, and a processor operatively connected to the display and the communication circuitry, wherein the processor is configured to transmit audio data to an external device through the communication circuitry, receive a user input for adjusting a volume level of an audio output through the external device in associated with the audio data, in response to the user input, check whether a first volume level being set in the electronic device is within a specified range, based on whether the first volume level being set in the electronic device is within the specified range, select one of the first volume level of the electronic device or a second volume level of the external device to be adjusted corresponding to the user input, when the first volume level is selected, the first volume level is adjusted corresponding to the user input and display a first UI comprising a first volume object indicating the first volume level and a first target object indicating the electronic device, and when the second volume level is selected, the second volume level is adjusted corresponding to the user input and display a second UI comprising a second volume object indicating the second volume level and a second target object indicating the external device.

In accordance with another aspect of the disclosure, a method of controlling a volume of an electronic device is provided. The method includes transmitting audio data to an external device connected via wireless communication, receiving a user input for adjusting a volume level of an audio output through the external device in associated with the audio data, in response to the user input, checking whether a first volume level being set in the electronic device is within a specified range, based on whether the first volume level being set in the electronic device is within the specified range, selecting one of the first volume level of the electronic device or a second volume level of the external device to be adjusted corresponding to the user input, when the first volume level is selected, the first volume level is adjusted corresponding to the user input and displaying a first UI comprising a first volume object indicating the first volume level and a first target object indicating the electronic device, and when the second volume level is selected, the second volume level is adjusted corresponding to the user input and displaying a second UI comprising a second volume object indicating the second volume level and a second target object indicating the external device.

In accordance with another aspect of the disclosure, an electronic device is provided. The electronic device includes a display, communication circuitry, and a processor operatively connected to the display and the communication circuitry, wherein the processor is configured to establish a Wi-Fi Direct (WFD) connection with an external device through the communication circuitry, transmit audio data to the external device through the WFD connection, receive a user input for increasing a volume level of an audio output through the external device, while the audio is output by the external device, check a first volume level being set in the electronic device, increase the first volume level of the electronic device in response to the user input, when the first volume level of the electronic device is less than a reference value, display a volume panel UI comprising a graphic object indicating the electronic device and the first volume level of the electronic device, in response to an increase in the first volume level of the electronic device, change the graphic object indicating the electronic device and the first volume level of the electronic device to a graphic object indicating the external device and the second volume level of the external device, when the first volume level increases above a reference value, and increase the second volume level of the external device in response to the user input.

In accordance with an aspect of the disclosure, an electronic device is provided. The electronic device includes a display, a communication circuitry, and a processor operatively connected to the display and the communication circuitry, wherein the processor is configured to transmit audio data to an external device through the communication circuitry, receive a user input for volume adjustment, check whether the volume level set in the electronic device is within a specified range, select at least one device, based on a result of the check, to adjust a volume level from the electronic device and the external device in response to the user input, display a volume panel UI including volume information and a graphic object indicating the selected one of the electronic device or the external device on the display in case of changing the volume level of the selected one of the electronic device or the external device, and change the graphic object and volume information indicating the selected one of the electronic device or the external device displayed on the volume panel UI to a graphic object and volume information indicating the other of the electronic device or the external device in case of changing the volume level of the other of the electronic device or the external device according to a user input while displaying the volume panel UI.

In accordance with another aspect of the disclosure, a method of controlling a volume of an electronic device is provided. The method includes transmitting audio data to an external device connected via wireless communication, receiving a user input for volume adjustment, checking whether the volume level set in the electronic device is within a specified range, selecting at least one of the electronic device and the external device to adjust the volume level in response to the user input, based on the checking result, displaying a volume panel UI including volume information and a graphic object indicating a selected one of the electronic device or the external device on the display in case of changing the volume level of the selected one of the electronic device or the external device, and changing the graphic object and volume information indicating the selected one of the electronic device or the external device displayed on the volume panel UI to the graphic object and volume information indicating the other of the electronic device or the external device in case of changing the volume level of the other of the electronic device or the external device according to a user input while displaying the volume panel UI.

In accordance with another aspect of the disclosure, an electronic device is provided. The electronic device includes a display, communication circuitry, and a processor operatively connected to the display and the communication circuitry, wherein the processor is configured to establish a Wi-Fi Direct (WFD) connection with an external device through the communication circuitry, transmit audio data to the external device through the WFD connection, receive a user input for increasing the volume while the audio data is output by the external device, check the volume level set in the electronic device, increase the volume level of the electronic device in response to the user input in case that the volume level of the electronic device is less than the reference value, display a volume panel UI including a graphic object indicating the electronic device and volume information of the electronic device, in response to an increase in the volume level of the electronic device, change the graphic object indicating the electronic device and volume information of the electronic device of the volume panel UI to a graphic object indicating the external device and volume information of the external device in case that the volume level of the electronic device increases above a reference value, and increase the volume level of the external device in response to the user input.

Various embodiments may provide a method wherein, when an electronic device connected to an external device through wireless communication outputs audio, it is possible to appropriately select a device, the volume of which is to be adjusted according to a user input for volume adjustment, and to adjust the volume level of the electronic device and that of the external device in a balanced manner, thereby enabling the user to control the audio volume easily and conveniently while solving problems such as ear shocks.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 11 is a flowchart of a method of controlling an audio volume of an electronic device according to an embodiment of the disclosure.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
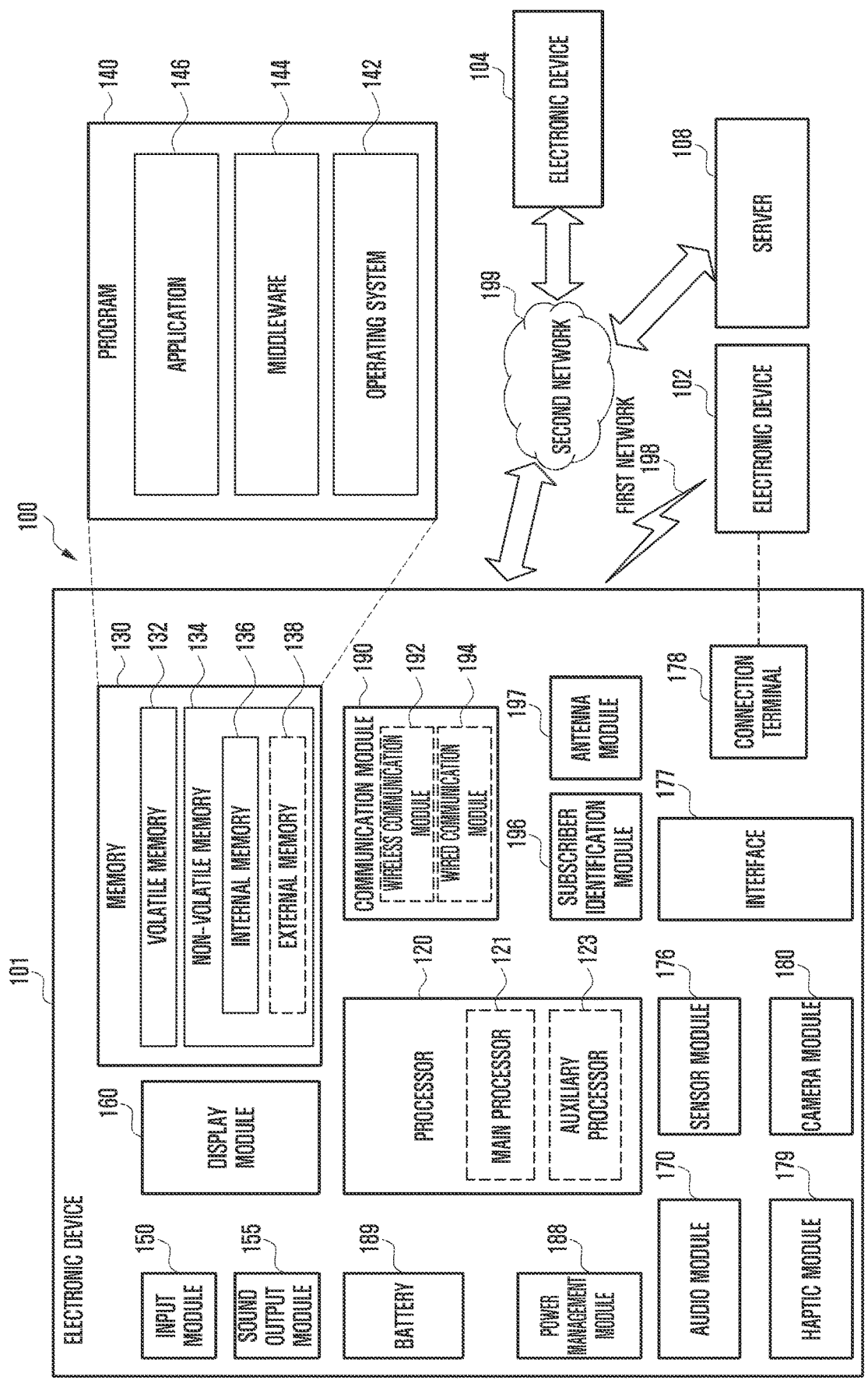
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
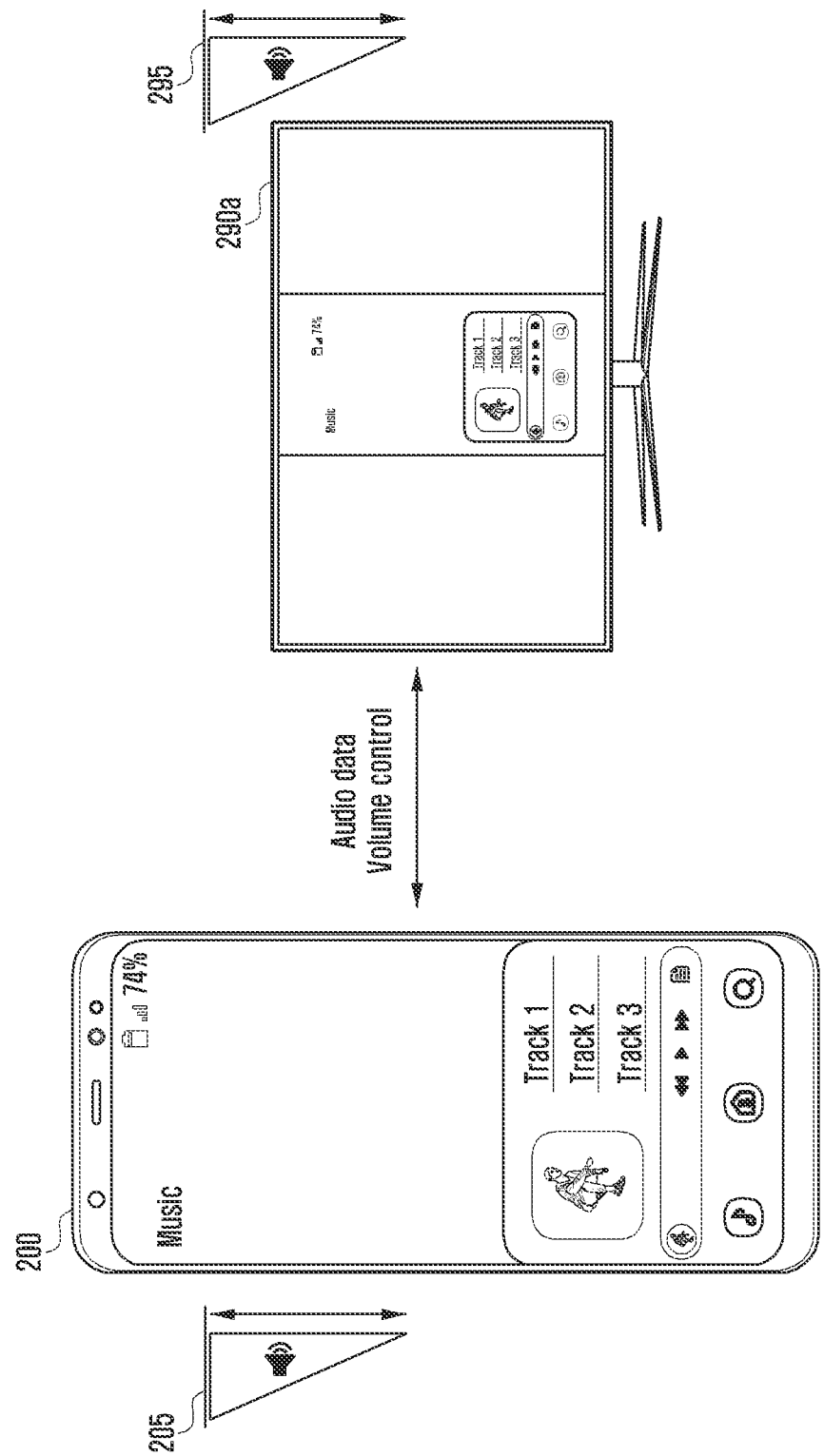
FIGS. 2A and 2B illustrate examples of electronic devices and external devices according to various embodiments of the disclosure.
Figure 2B:
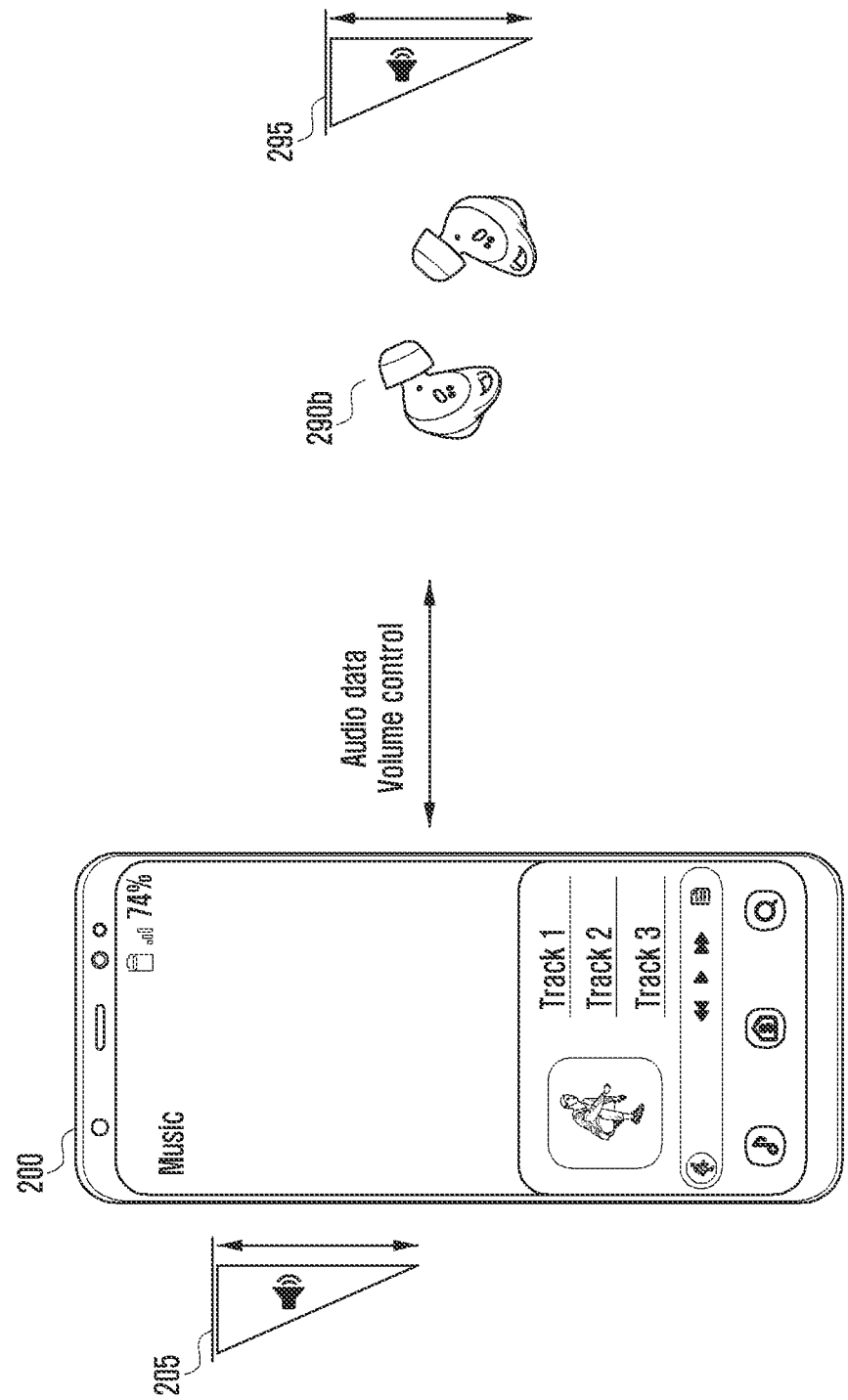

FIGS. 2A and 2B illustrate examples of electronic devices and external devices according to various embodiments of the disclosure.

Referring to FIG. 2A, an electronic device 200 may be connected to an external device 290a (e.g., a TV) via a mirroring function. The mirroring function may be a function of transmitting a screen (or generated data) displayed on the electronic device 200 to the external device 290a and displaying the same on the external device 290a using a short-range wireless communication technology (e.g., Wi-Fi direct) such as Miracast (or Smartview). In this embodiment, the electronic device 200 may operate as a source device (e.g., the source device 500 of FIG. 5) and the external device 290a may operate as a sink device (e.g., the sink device 590 in FIG. 5) of the mirroring function.

When the electronic device 200 is connected to the external device 290a through a mirroring function, audio data of the electronic device 200 may also be transmitted to the external device 290a, and the external device 290a may output both image data and audio data.

According to various embodiments, the electronic device 200 and the external device 290a may each have a volume level and may have an independent volume control function. For example, the electronic device 200 may adjust the volume level 205 of the electronic device 200 according to an input through the volume key provided outside the housing or a touch input on the volume panel user interface (UI), and the external device 290a may also adjust the volume level 295 of the external device 290a according to an input of a remote control or a volume key. In this case, the volume of audio data actually output from the external device 290a may be determined based on both the volume level 205 configured by the electronic device 200 and the volume level 295 configured by the external device 290a (e.g., sum or product of two volume levels).

According to various embodiments, the electronic device 200 may adjust the volume level 295 of the external device 290a using a volume key of the electronic device 200 or a volume panel UI. For example, the external device 290a may adjust the volume level 295 of the external device 290a by receiving a volume control event from the electronic device 200 and may check whether the electronic device 200 supports volume control during a capability check step when the electronic device 200 and the external device 290a are mirrored.

Referring to FIG. 2B, an external device 290b may be an audio output device (e.g., an ear bud) that is connected to the electronic device 200 via short-range wireless communication (e.g., Bluetooth) and outputs audio data. The external device 290b may adjust the volume level 295 of the external device 290b through a touch panel or a key.

According to various embodiments, in the embodiment of FIG. 2B same as in the embodiment of FIG. 2A, the electronic device 200 and the external device 290b may each have an independent volume control function, and the electronic device 200 may adjust the volume level 295 of the external device 290b using a volume key of the electronic device 200 or a volume panel UI.

According to various embodiments, in a situation in which the electronic device 200 is connected to the external devices 290a and 290b and outputs audio data through the external devices 290a and 290b, when receiving a user input (e.g., volume key input) for adjustment of a volume level of an audio output through the external devices 290a and 290b, the electronic device 200 may select at least one device to adjust the volume level based on the volume level 205 of the electronic device 200 and/or the volume level 295 of the external devices 290a and 290b. For example, in case the external devices 290a and 290b support a volume control function based on an input on the electronic device 200, when a user inputs on the electronic device 200, the volume level 205 of the electronic device 200 may be increased or decreased, the volume level 295 of the external devices 290a and 290b may be increased or decreased, or both the volume level 205 and 295 may be increased or decreased. According to an embodiment, the electronic device 200 may select at least one device to adjust the volume level further based on an audio output mode and/or a user's configuration.

Hereinafter, various embodiments for appropriately selecting a device to adjust the volume in response to a user input for adjusting the volume will be described with reference to FIGS. 3 to 9.

The various embodiments of the disclosure are not limited to the devices 290a and 290b of FIGS. 2A and 2B, and may be applied without limitation to the type of device (e.g., speaker, car audio, laptop PC, and tablet PC) that is connected to the electronic device 200 through wireless communication to output audio data and supports volume control independent of the electronic device 200.

Figure 3:
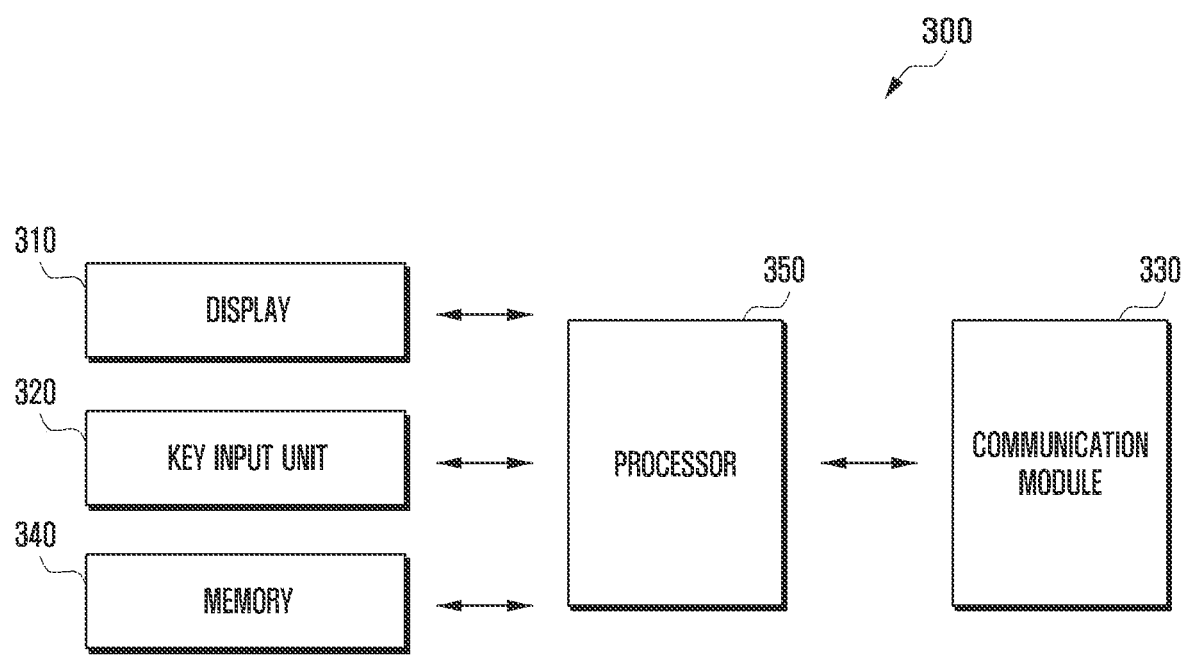
FIG. 3 is a block diagram of an electronic device according to an embodiment of the disclosure.

FIG. 3 is a block diagram of an electronic device according to an embodiment of the disclosure.

Referring to FIG. 3, an electronic device 300 may include a display 310, a key input unit 320, a communication module 330, a processor 350, and a memory 340 and various embodiments of the disclosure may be implemented even if at least some of the illustrated components are omitted and/or substituted. The electronic device 300 may further include at least some of the configuration and/or functions of the electronic device 101 of FIG. 1.

Some of the components (e.g., the processor 350, the memory 340, and the communication module 330) illustrated in FIG. 3 and/or other components of the electronic device 300 not illustrated in FIG. 3 may be disposed inside the housing (not illustrated) of the electronic device 300, and some other components (e.g., the display 310, the key input unit 320) may expose at least a part of them to the outside of the housing.

According to various embodiments, the display 310 displays an image, and may be implemented as any one of a liquid crystal display (LCD), a light emitting diode display (LED), an organic light emitting diode (OLED) display, a micro electro-mechanical system (MEMS) display, or an electronic paper display, but is not limited thereto. The display 310 may include at least some of the configuration and/or functions of the display module 160 of FIG. 1. The display 310 may include a touch screen that senses a touch input and/or a proximity input (or hovering input). The touch screen may be implemented in any one of various methods including an in-cell method and an on-cell method.

According to various embodiments, the display 310 may display a volume panel user interface (UI) including volume information of the electronic device 300 and/or an external device (e.g., the external device 290*a* of FIG. 2A and the external device 290*b* of FIG. 2B), and receive a user input for volume control on the volume panel UI. For example, when a volume level of the electronic device 300 is adjusted, the volume panel UI may include a first volume object indicating a volume level of the electronic device 300 and a first target object indicating the electronic device 300. When a volume level of the external device is adjusted, the volume panel UI may include a second volume object indicating a volume level of the external device and a second target object indicating the external device.

According to various embodiments, the key input unit 320 may include at least one key disposed outside the housing of the electronic device 300. For example, the key input unit 320 may include a volume control button, a home button, and an end button, and the volume control button may separately include a volume up/down key. According to an embodiment, the electronic device 300 may configure the key input unit 320 in the form of a touch panel, and may perform a control operation such as volume control according to the time, pressure, and direction of touch movement of the touch input on the touch panel.

According to various embodiments, the electronic device 300 may receive a volume control signal based on a user input on a second external device different from the external device to output audio data. For example, the electronic device 300 may be connected to a second external device (e.g., a wearable device) through the communication module 330 and may receive a user input for volume control from the second external device.

According to an embodiment, when the second external device is connected to the electronic device 300 while the electronic device 300 is connected to the external device, the volume level of the electronic device 300 and/or the external device may be adjusted according to a user input on the electronic device 300 and/or a user input on the second external device. In this case, the scales of the volume levels controllable by the electronic device 300, the external device, and the second external device may be different from each other. For example, within the range of the total adjustable volume level, the external device may be adjusted in units of 100 levels, the electronic device 300 may be adjusted in units of 20 levels, and the second external device may be adjusted in units of 10 levels. According to an embodiment, the processor 350 may scale an adjustment level of a user input for volume adjustment according to a scale of a volume level controllable in each device. For example, in case that one-time volume increase input is received from the external device, a volume increase input is received from the external device once, when increasing the volume level of the electronic device 300, it may be increased by 2 levels out of the total 20 levels, and when increasing the volume level of the external device, it may be increased by 10 levels out of the total 100 levels. In case that one-time volume increase input is received from the key input unit 320 of the electronic device 300, when increasing the volume level of the electronic device 300, it may be increased by 1 level out of the total 20 levels, and when increasing the volume level of the external device, it may be increased by 5 levels out of the total 100 levels.

According to various embodiments, the communication module 330 may include various configurations including an antenna (not illustrated), an RF front end (not illustrated), and a communication processor supporting short-range wireless communication with the external device. The communication module 330 may support various short-range wireless communication methods (e.g., Bluetooth, Bluetooth low energy (BLE), and Wi-Fi), and may include an independent hardware and/or software configuration for supporting each wireless communication method. According to an embodiment, some components (e.g., a communication processor) of the short-range communication module 330 may be included in the processor 350. The short-range communication module 330 may include at least some of the configuration and/or functions of the communication module 190 of FIG. 1.

According to various embodiments, the memory 340 is for temporarily or permanently storing unrestricted digital data, and may include at least one of a configuration and/or function of the memory 130 of FIG. 1. The memory 340 may include non-volatile memory such as one time programmable ROM (OTPROM), programmable ROM (PROM), erasable and programmable ROM (EPROM), electrically erasable and programmable ROM (EEPROM), mask ROM, flash ROM, flash memory (e.g., NAND flash or NOR flash), hard drive, or solid state drive (SSD), and volatile memory such as dynamic RAM (DRAM), static RAM (SRAM), or synchronous dynamic RAM (SDRAM).

The memory 340 may store various instructions that may be executed by the processor 350. Such instructions may include various control instructions including arithmetic and logical operations, data movement, and input/output that can be recognized by the processor 350.

According to various embodiments, the processor 350 is a configuration (e.g., an application processor) capable of performing an operation or data processing related to control and/or communication of each component of the electronic device 300, and may include at least some of the components and/or functions of the processors 350, 120 of FIG. 1. The processor 350 may be operatively, functionally, and/or electrically connected to each component of the electronic device 300 including the display 310, the short-range communication module 330, the sensor, and the memory 340.

According to various embodiments, there will be no limit to the operation and data processing functions that the processor 350 can implement in the electronic device 300, but in the disclosure, various embodiments for controlling a volume level of an electronic device 300 and/or an external device based on a user input through a key input unit 320 (or touch panel) of the electronic device 300 will be described.

According to various embodiments, the processor 350 may establish a wireless connection for transmission of audio data with an external device using the communication module 330. The processor 350 may transmit audio data generated in real time by the electronic device 300 to the external device in the form of audio streaming through an established wireless connection. According to another embodiment, the processor 350 may transmit the audio file itself to the external device (e.g., digital living network alliance (DLNA) streaming and direct streaming (Miracast R2)) or transmit information on the audio source (e.g., Casting, hypertext transfer protocol (HTTP) live streaming, and real time streaming protocol (RTSP)) to the external device to output audio data on the external device.

For example, when the electronic device 300 is connected to a TV, which is the external device, through a mirroring function (e.g., FIG. 2A), the electronic device 300 may establish a Wi-Fi Direct connection with the external device using the communication module 330 to transmit image and audio data. Alternatively, when the electronic device 300 is connected to ear buds, which is the external device (e.g., FIG. 2B), the electronic device 300 may establish a Bluetooth connection with the external device using the communication module 330 to transmit audio data. Hereinafter, an embodiment in which the electronic device 300 is connected to an external device through a mirroring function (e.g., FIG. 2A) to transmit image and audio data will be mainly described. However, in addition to the mirroring function, the embodiments to be described later may be connected to an electronic device 300 through wireless communication to output audio data, and may also be applied when connected to an external device that supports independent volume control from the electronic device 300.

According to various embodiments, the processor 350 may check volume information of the external device from the external device. The processor 350 may check whether the external device supports volume control through a user input on the electronic device 300 in the process of connecting the mirroring session with the external device. For example, the electronic device 300 and the external device may perform capability exchange and negotiation operations during a mirroring session connection process, and transmit and receive information on whether to support volume control on messages (e.g., M3 (RTSP GET_PARAMETER request), M3 response) transmitted and received during capability exchange and negotiation operations.

According to various embodiments, the processor 350 may transmit/receive information on whether to support volume control and current volume status information of an external device through messages transmitted and received during capability exchange and negotiation operations. For example, only when the external device supports volume control, the current volume level value and volume level step (minimum volume level/maximum volume level) information of the external device may be transmitted through the message. In addition, if processing the mute request of the electronic device 300 is possible, the external device may respond by inserting a mute message.

For example, the processor 350 may transmit the M3-RTSP GET_PARAMETER request message including wfd_sec_volume_support and wfd_sec_volume_status to request volume status information and whether to support volume control during capability exchange and negotiation operation, and if the external device supports volume control, it may transmit an M3 response message including a response to whether to support volume control and minimum volume/maximum volume level/current volume level/mute support. If the external device does not support volume control, it can respond with none to the message.

In addition, when a request for volume control methods supported by an external device and a response are received during capability exchange, the electronic device 300 may request it through the wfd_sec_volume_control_mode parameter, and the external device may transmit a response message including information on the volume control method, such as wfd_sec_volume_control_mode: source-|sink|dual|sync, in response thereto. The processor 350 (e.g., volume manager) may determine one of the volume control methods by combining the current volume level of the devices, the volume control step, and the volume control method supported by the external device, and notify the determined control method in the M4 message transmission/reception step. This is to operate in the same volume control method not only in an electronic device but also in volume control through an external device.

This control method may be changed again through the SET PARAMETER message after the session is established, that is, after the connection is completed.

According to various embodiments, the processor 350 may check volume information set on the electronic device 300. The processor 350 may set volume information for each type of sound (e.g., audio data, system alarm, and call ring sound) to be output and/or an output path (e.g., speaker of the electronic device 300, mirroring, and Bluetooth earphone) of audio data.

According to various embodiments, the processor 350 may receive a user input for volume adjustment. The user input for adjusting the volume may include a press input on a volume control button of the key input unit 320 or a touch input on a touch pad. The processor 350 supports independent volume control for each type of sound (e.g., audio data, system alarm, and call ring sound) to be output and/or an output path (e.g., speaker of the electronic device 300, mirroring, and Bluetooth earphone) of audio data, and when a user input is received while audio data is being output through an external device, the processor 350 may perform volume control of the corresponding audio data.

According to various embodiments, the processor 350 may select at least one of the electronic device 300 and the external device to adjust the volume level based on a user input for adjusting the volume. In other words, the processor 350 may select one of a first volume level of the electronic device 300 or a second volume level of the external device based on a user input for adjusting the volume. In the present disclosure, the first volume level may be a volume level of an audio data set by the electronic device 300 and the second volume level may be a volume level of an audio data set by the electronic device 300. For example, the processor 350 may increase or decrease only the volume level of the electronic device 300, increase or decrease only the volume level of the external device, or increase or decrease the volume level of both the electronic device 300 and the external device according to a user input. The processor 350 may select at least one device to adjust the volume level based on a volume level of the electronic device 300, a volume level of the external device, an audio operation mode, and/or a user setting when receiving a user input.

The processor 350 may determine a volume control method based on volume levels and volume steps of the electronic device and the external device by the volume manager, and may select various volume control methods according to user settings.

The volume control method may be Source/Sink/Dual/Sync/Alternate as an example, and the operation method of each control method is as follows.

1) Source: volume level control of the source terminal
2) Sink: adjust the volume level of the sink terminal
3) Dual: set the volume of all devices equally based on the higher volume of the two devices, and then adjust the volume of both devices together
4) Sync: adjust the volume step of the Sink (external device) to the volume step of the Source (electronic device) and then adjust the volume of the Sink (from the perspective of maintaining the usability of the volume control of the source)
5) Alternate: alternately control the volume of two connected devices According to an embodiment, as a method of determining the volume control method based on the volume level, first check the volume level (or first volume level) of the electronic device 300 and the volume level (or second volume level of the external device, and if the volume level of the electronic device 300 is less than the reference value, it is important to increase the volume level of the electronic device 300 first. In this case, a method of controlling only the volume level of the electronic device 300 may be selected. Accordingly, it is possible to solve a volume imbalance problem that may occur by first adjusting the volume level of the external device.

Conversely, when the volume level of the external device is less than the reference value, by selecting a method of controlling the volume level of only the external device, only the volume level of the external device is adjusted so that sufficient sound may be heard through the external device.

According to an embodiment, as a method of determining based on the volume step, if the volume level ranges of the two connected devices are the same, the volume level of the connected devices may be equally adjusted based on the higher volume level of the two devices by selecting the dual control method, and then the volume levels of the two terminals may be adjusted together.

According to an embodiment, if the volume level ranges of the two devices are different, a sync control method may be selected to adjust the volume step of the external device to the volume step of the electronic device to maintain the user experience, and then control the volume of the external device. For example, assuming that the volume step of the electronic device 300 is composed of 10 steps and the volume step of the external device is 100, when the volume is adjusted in the electronic device 300, it is expressed in the UI as if one level is increased like the volume of the electronic device, but in reality, the volume of the external device may be increased by 10/100. In the case of this method, when an event for volume control is received, it must increase according to the volume step of the source, so the volume level 10 corresponding to step 1 is received through SET_PARAMETER MSG and may be operated to increase or decrease by the corresponding level during volume control.

According to an embodiment, in the case of Alternate, the volume levels of the electronic device 300 and the external device are unconditionally alternately controlled regardless of the volume level/volume step. This may be a simple but sure way to resolve the volume imbalance.

According to an embodiment, the electronic device 300 may transmit the determined volume control method to an external device through a SET_PARAMETER message. The external device may perform volume control according to the received control method.

For example, when it is determined that the electronic device 300 operates in a sync control method, the electronic device 300 may transmit RTSP SET_PARAMETER as wfd_sec_volume_control: sync 10. The transmitted message includes the volume control method and additionally necessary information for the corresponding control method and in the case of the sync control method, since it must operate based on the volume step of the external device, it may operate by receiving information on the volume value corresponding to the first step.

According to various embodiments, the processor 350 may check whether the volume level of the electronic device 300 is within the specified range, and may determine the volume control target based on this. For example, when a volume increase is input, the processor 350 may transmit a volume control signal to the external device through the communication module 330 to increase the volume level of audio data to be transmitted to the external device when the volume level of the electronic device 300 is within the specified range (e.g., less than the first reference value), and increase the volume of the external device when the volume level of the electronic device is not within the specified range (e.g., equal to or more than the first reference value).

According to various embodiments, the processor 350 may determine a volume control target further based on the volume level of the external device. For example, when a volume decrease is input, the processor 350 may transmit a volume control signal to the external device through the communication module 330 to decrease the volume level of audio data to be transmitted to the external device when the volume level of the external device is within the specified range (e.g., less than the second reference value), and decrease the volume of the external device when the volume level of the external device is not within the specified range (e.g., equal to or more than the second reference value).

According to another embodiment, the processor 350 may adjust the volume level of the electronic device 300 and/or the external device according to the specified range only when the volume is increased (or decreased), and may only adjust the volume level of the specific device when the volume is decreased (or increased). For example, when the volume is reduced, the processor 350 may not control the volume of the electronic device 300 and may transmit a volume control signal to the external device to reduce the volume of the external device.

According to various embodiments, the processor 350 may determine a volume control target further based on an audio operation mode currently being executed. The audio operation mode may include a mirroring mode (e.g., Miracast, and Smartview), an audio file transfer mode (e.g., digital living network alliance (DLNA) streaming, and a direct streaming (Miracast R2)), and an audio source transfer mode (e.g., Casting, hypertext transfer protocol (HTTP) live streaming, and real time streaming protocol (RTSP)). For example, in a mode in which audio data of an electronic device 300 is streamed in real time and output on an external device, such as in a mirroring mode, as described above, the processor 350 may select a volume control target based on the volume level of the electronic device 300 and/or the external device, and in a mode in which an electronic device 300 generates audio data in real time and outputs audio from an external device without transmitting it to an external device, such as an audio file transmission mode or an audio source transmission mode, the external device may be determined as a target for volume control. In addition, in a mode in which audio is not output on the external device, such as when the electronic device 300 and the external device are not connected or the connection is paused, the electronic device 300 may be determined as a volume control target.

According to various embodiments, the processor 350 may determine a volume control target further based on a user setting. For example, when a volume increase or decrease is input on the key input unit 320 through a setting menu, the electronic device 300 may determine in advance a target to control the volume level. In this case, the volume control target may be set for each volume level and audio operation mode of the electronic device 300 and/or the external device.

Hereinafter, various embodiments of adjusting the volume level of the electronic device 300 and/or the external device according to a volume level, an audio operation mode, and a user setting of the electronic device 300 and/or the external device will be described. Since the following embodiments are not mutually exclusive, several embodiments may be applied together.

According to an embodiment, when the user inputs a volume increase, the processor 350 may first increase the volume level of the electronic device 300 until the volume level of the electronic device 300 reaches the first reference value (or when the volume level of the electronic device is less than the first reference value). The first reference value may be a maximum value of the volume level or a value designated such as 90% of the maximum value. When the user continues to input the volume increase and the volume level of the electronic device 300 reaches the first reference value, subsequently, if the volume increase input is continuously input, the processor 350 may transmit a volume control signal to the external device to increase the volume of the external device.

According to an embodiment, when the user inputs a volume decrease, the processor 350 may first decrease the volume level of the external device until the volume level of the external device reaches the second reference value (or when the volume level of the external device is equal to or more than the second reference value). The second reference value may be a minimum value of the volume level or a value designated such as 10% of the maximum value. When the user continues to input the volume decrease and the volume level of the external device reaches the second reference value, subsequently, if the volume decrease input is continuously input, the processor 350 may decrease the volume level of the audio data of the electronic device 300.

According to an embodiment, the processor 350 may set the volume level of each device at the time of initial connection with the external device (e.g., mirroring session connection and Bluetooth pairing) as a reference value. For example, when mirroring session connection with the external device, the processor 350 may receive volume information of the external device and store the volume level of the electronic device 300 and the volume level of the external device in the memory 340. When a user inputs a volume increase, the processor 350 may first increase the volume level of the electronic device 300 according to a priority condition. Thereafter, while increasing the volume level of the electronic device and, when the volume level of the electronic device 300 becomes the same as the volume level at the time when the external device is initially connected, the volume level of the external device may be increased in response to a volume increase input from thereafter. Conversely, when the user inputs a volume decrease, the processor 350 decreases the volume level of the external device and, when the volume level of the external device becomes the same as the volume level of the electronic device 300 at the time of initial connection, the volume level of the electronic device 300 may be decreased in response to a volume decrease input from thereafter.

According to an embodiment, the electronic device 300 may transmit an audio data file itself to the external device, and the external device may output a corresponding audio data file. For example, in the case of digital living network alliance (DLNA) streaming and direct streaming (Miracast R2), unlike the mirroring function (e.g., Miracast), the audio data file itself may be transmitted to an external device, and the audio data may be output by playing the file by an application of the external device. In this case, even if the volume level of the electronic device 300 is adjusted, since the audio data of the external device is not affected, the processor 350 may transmit a volume control signal to the external device in response to a user input for volume control.

According to an embodiment, the electronic device 300 may transmit information on an audio source to an external device, and the external device may access the audio source and output audio data. Examples of this method include Casting, hypertext transfer protocol (HTTP) live streaming, and real time streaming protocol (RTSP). Even in this case, even if the volume level of the electronic device 300 is adjusted, since the audio data of the external device is not affected, the processor 350 may transmit a volume control signal to the external device in response to a user input for volume control.

According to an embodiment, the electronic device 300 may output audio data on different devices for each application, such as a multi-sound function and separate reproduction of application sound. For example, through a mirroring function, the electronic device 300 may transmit image and audio data to the first external device (e.g., TV) for the first application (e.g., media playback) and transmit audio data to the second external device (e.g., Bluetooth earbuds) for the second application (e.g., music playback). In this case, when a user input for volume control, the processor 350 may transmit a volume control signal to an external device connected to an application running in the foreground among the first application and the second application being executed.

According to an embodiment, even when the electronic device 300 is connected to an external device, it may be set to output audio data on the electronic device 300. In this case, the processor 350 may adjust the volume level of the electronic device 300 in response to a user input for volume adjustment.

According to an embodiment, even when the electronic device 300 is mirrored to an external device, sounds such as a system, a notification, and a call ringtone may be output through a speaker of the electronic device 300 in addition to audio data of an application such as media/music. As described above, when a volume control signal is input through the key input unit 320 while audio is being output through the speaker of the electronic device 300, the processor 350 may adjust the volume level of the electronic device 300.

According to an embodiment, in a state in which the electronic device 300 is mirrored to an external device, a function of temporarily stopping screen sharing while maintaining the mirroring connection may be provided. In this way, when screen sharing is paused, only an image stream (or a paused image) may be transmitted to an external device and audio may be output through the electronic device 300. In this case, since audio data is output on the electronic device 300, the processor 350 may adjust the volume level of the electronic device 300 in response to a user input for adjusting the volume.

According to an embodiment, the external device may display a screen mirrored from the electronic device 300 and a screen generated by the external device (e.g., a TV channel screen) as a split screen (or multi view). In this case, the audio focus for volume control may be set to one of the split screens. For example, when the audio focus is on the TV channel screen of the external device, even if the screen mirrored by the electronic device 300 is displayed on another split screen, the external device may output audio data of an audio-focused TV channel without outputting audio data transmitted from the electronic device 300. In this case, since audio data of the electronic device 300 is not being output from the external device, the processor 350 may adjust the volume level of the external device in response to a user input for volume adjustment.

According to an embodiment, the processor 350 may select a volume control target according to the number of user inputs for volume control. For example, the volume level of the external device may be adjusted until a user input is input a predetermined number of times (e.g., 5 or 10 times), and the volume level of the electronic device 300 may be adjusted after a predetermined number of inputs.

According to an embodiment, after adjusting the volume level of the electronic device 300 and/or the external device according to the user input, the processor 350 may synchronize the volume level of the two devices and adjust the volume level of the electronic device 300 and the external device when the volume level of the electronic device and the external device are the same.

In this case, if the volume level difference between the two devices is large, many inputs may be required until the volume level becomes the same, so that the processor 350. In order to quickly catch up to this difference in volume level, when a volume control is input, the processor 350 increases a value corresponding to a certain ratio (e.g., 1/2) of the volume difference between the two devices and repeats this calculation process to reduce the gap until synchronization more quickly and smoothly.

According to an embodiment, the processor 350 may always adjust the volume levels of the electronic device 300 and the external device at the same time according to a user input.

According to an embodiment, the electronic device 300 may be connected to a plurality of external devices to output audio data through each of the external devices. In this case, since the current volume levels of each external device may be different, the processor 350 may preferentially adjust the volume level of the electronic device 300 in response to a user input. Thereafter, when the volume level of the electronic device 300 reaches the reference value (e.g., a maximum value for a volume increase input, a minimum value for a volume decrease input), the processor 350 may transmit a volume control signal to each external device so that the volume level of each external device is adjusted.

According to an embodiment, the processor 350 may always adjust the volume levels of the electronic device 300 and the external device at the same time according to a user input.

According to various embodiments, the processor 350 may provide a volume panel UI indicating volume information on the display 310. According to various embodiments, volume panel UI may include a volume object indicating a volume level and a target object indicating a device of which the volume is adjusted. For example, in a state in which the electronic device 300 is not connected to the external device, that is, in a state in which various sounds are output through the electronic device 300, the volume panel UI may include a volume bar for each type of sound (e.g., media, ringtone, notification, and system). Thereafter, when the electronic device 300 is connected to an external device and the external device supports a volume control function, the processor 350 may add a volume bar for adjusting the volume of the external device to the volume panel UI. When the volume level of the electronic device 300 or the external device is adjusted according to a user input for volume control, the processor 350 may adjust a volume bar corresponding to the device to be adjusted.

According to various embodiments, the processor 350 may display a reduced version of a volume panel UI including only a volume bar of a volume that is adjusted when volume is adjusted. In this case, the reduced version of the volume panel UI may display an item corresponding to a device or function (e.g., media of the electronic device 300, an external device, a ring tone, a notification, and a system) to which the volume is adjusted.

According to various embodiments, when the processor 350 adjusts the volume level of the electronic device 300 according to the user input for volume control and then adjusts the volume level of the external device, the processor may change from the volume panel UI corresponding to the electronic device 300 (or the media volume of the electronic device 300) to the volume panel UI corresponding to the external device.

In addition, the configuration of the volume panel UI may be different according to the volume control method. For example, when the volume control method is determined to be one of source, sink, dual, sync, or alternative, the processor 350 may display a graphic object indicating the corresponding method on the volume panel UI.

According to various embodiments, the processor 350 may present UI components of selected device and unselected device with different graphic effects. For example, when the first volume level of the electronic device 300 is selected to be adjusted, the processor 350 may display a graphic object indicating the electronic device 300 and a first volume level of the electronic device with a first graphic effect, and a graphic object indicating the external device and a second volume level of the external device with a second graphic effect different from the first graphic effect.

An example of the volume panel UI provided by the electronic device 300 will be described in more detail with reference to FIGS. 7A and 7B and FIGS. 8A to 8C.

Figure 4:
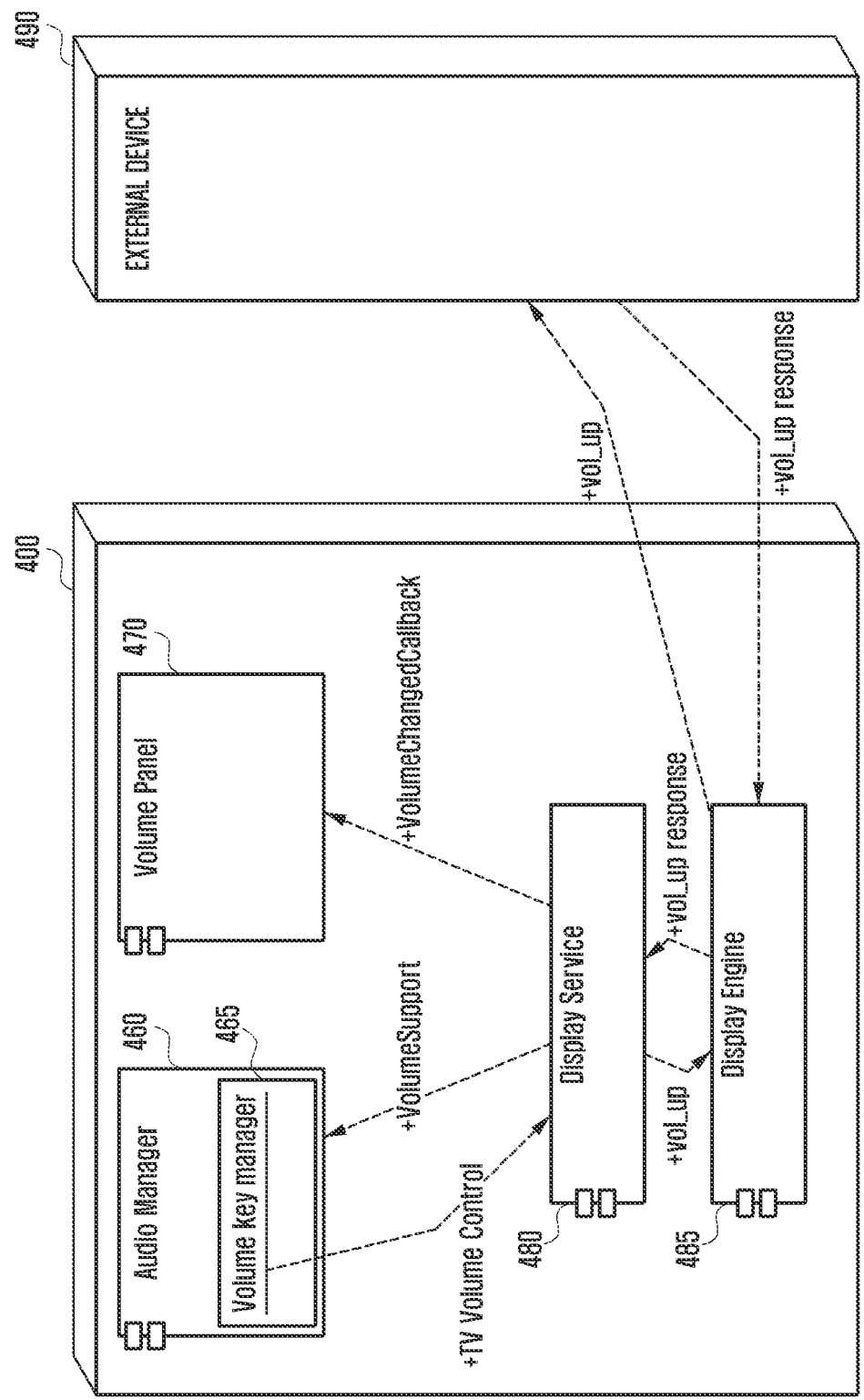
FIG. 4 is a block diagram of an electronic device and an external device according to an embodiment of the disclosure.

FIG. 4 is a block diagram of an electronic device and an external device according to an embodiment of the disclosure.

Referring to FIG. 4, components on a framework level and/or an application layer operating on an electronic device 400 (e.g., the electronic device 200 of FIG. 2A) when the electronic device 400 and an external device 490 (e.g., the external device 290a of FIG. 2A) are mirrored is illustrated, and each illustrated component (or module) may be operated by a processor (e.g., the processor 350 of FIG. 3) of the electronic device 400.

According to various embodiments, a display engine 485 may control a short-range wireless communication connection with the external device 490 using a communication module (e.g., the communication module 330 of FIG. 3), and may perform an interface function of data and/or control and event information transmitted and received with the external device 490. The display engine 485 may transmit the audio/video stream generated by the processor to the external device 490.

According to various embodiments, the display engine 485 may check whether the external device 490 supports the volume control function in the capability check step during the mirroring session connection process, that is, whether it can control the volume of the external device 490 according to a user input on the electronic device 400.

When the external device supports volume control, the display engine 485 may check volume status information and a supported volume control method. In addition, the display engine 485 may select a volume control method based on the volume status information and the volume control method acquired in the Negotiation step and transmit it to the external device 490.

When the display engine 485 receives volume information of the external device 490 from the external device 490 and adjusts the volume level of the external device 490 according to a user input, the display engine may transmit a volume control signal to the external device 490.

According to various embodiments, the display service 480 may receive the volume level of the external device 490 from the display engine 485 and the volume level and volume state information of the electronic device 400 from an audio manager 460, and select a device to perform volume control based on the volume level and volume state information.

According to an embodiment, the display service 480 may select a device to process volume control further based on an audio operation mode being executed and a user's setting. When volume control is processed, the display service 480 may update the volume panel according to the adjusted volume level.

According to various embodiments, the audio manager 460 may perform various operations related to audio output control, such as outputting audio data and adjusting volume. For example, the audio manager 460 may check the volume level of the electronic device 400 and transmit it to the display service 480. The audio manager 460 may receive a user input through a key input unit (e.g., the key input unit 320 of FIG. 3) through a volume key manager 465 and transmit it to the display service 480, and may change a delivery route of the volume control signal according to whether the external device 490 supports the volume control function.

According to various embodiments, a volume panel component 470 may generate a volume panel UI to be displayed on a display (e.g., the display 310 of FIG. 3) according to the operation state of the electronic device 400. For example, the volume panel component 470 nay generate a volume panel UI including a volume bar for each type of sound (e.g., media, ringtone, notification, and system) in a state in which the electronic device 400 is not connected to the external device 490, and may add a volume bar for adjusting the volume of an external device 490 to the volume panel UI when the electronic device 400 is connected to an external device 490 and the external device 490 supports the volume control function. When the volume level of the electronic device 400 or the external device 490 is adjusted by the audio manager 460 and/or display service 480, the volume panel component 470 may reflect it on the volume panel UI, and when the volume control target device is changed, the volume panel component may change the volume panel UI including an icon corresponding to the changed device.

Figure 5:
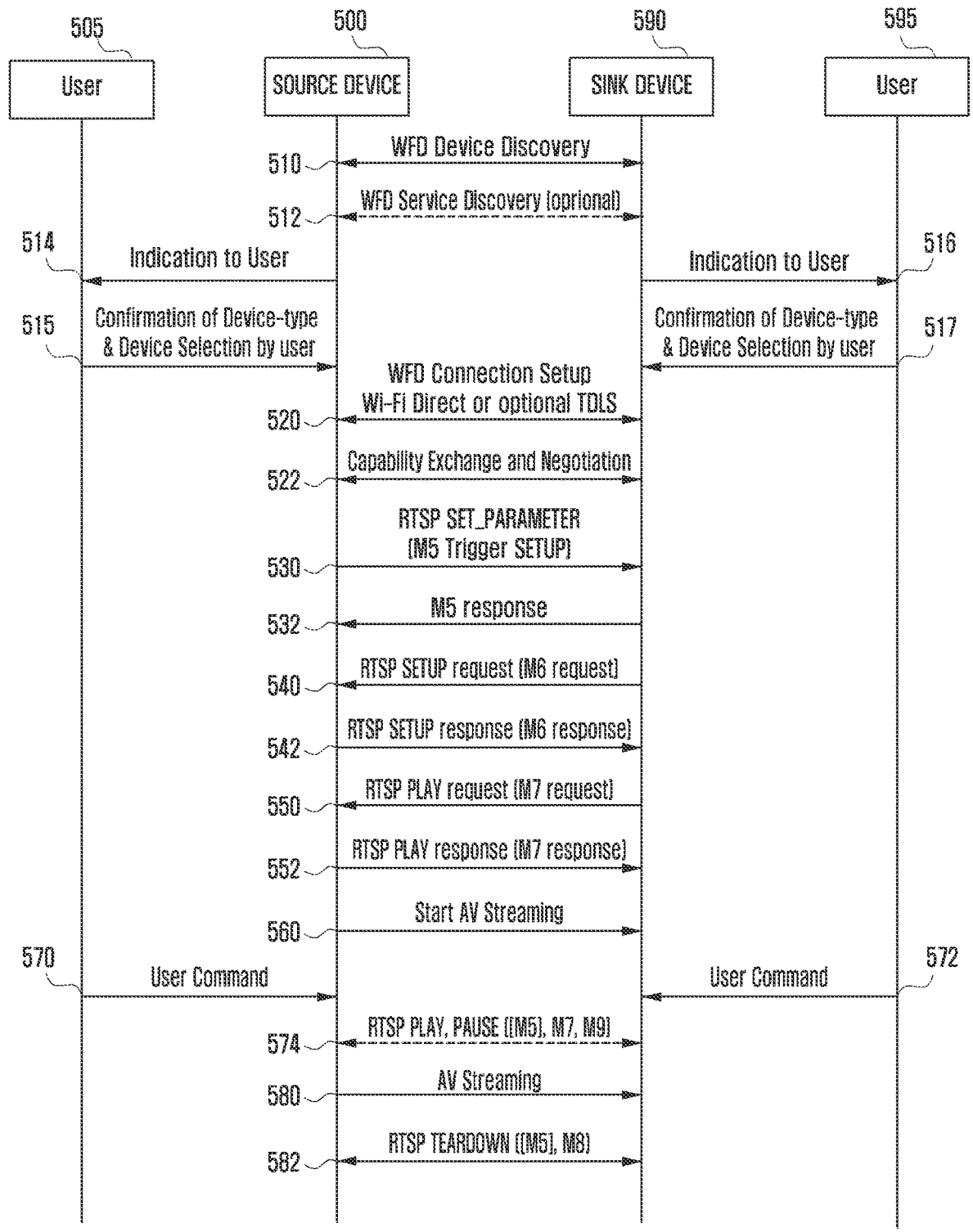
FIG. 5 is a flowchart illustrating a session connection operation when an electronic device and an external device are mirrored according to an embodiment of the disclosure.

FIG. 5 is a flowchart illustrating a session connection operation when an electronic device and an external device are mirrored according to an embodiment of the disclosure.

Referring to FIG. 5, a source device 500 may be a device (e.g., the electronic device 200 of FIG. 2A and the electronic device 300 of FIG. 3) that transmits audio data during a mirroring connection using Wi-Fi direct (WFD), and a sink device 590 may be a device (e.g., the external device 290a of FIG. 2A) that receives and outputs audio data. At least some of the illustrated operations may be defined in the Miracast protocol.

According to various embodiments, in operation 510, the source device 500 and the sink device 590 may activate a Wi-Fi module to discover adjacent WFD-connectable devices. In operation 512, the source device 500 and the sink device 590 may discover a service (or capability) that can be connected to each other.

According to various embodiments, in operation 514, the source device 500 may inform a user 505 of the discovered device and service, and in operation 515, the sink device 590 to be connected and the user's selection for the service may be received in operation 517.

According to various embodiments, in operation 516, the sink device 590 may inform a user 595 of the discovered device and service, and in operation 515, the source device 500 to be connected and the user's selection for the service may be received.

According to various embodiments, in operation 520, the source device 500 and the sink device 590 may perform connection setup related to WFD or tunneled direct link setup (TDLS).

According to various embodiments, in operation 522, the source device 500 and the sink device 590 may perform capability exchange and negotiation of each device. For example, the source device 500 and the sink device 590 may determine a parameter set defining audio and video payloads during WFD session connection through message exchange based on real-time streaming protocol (RTSP).

According to various embodiments, in the process of capability exchange and negotiation, the sink device 590 may inform the source device 500 whether or not a volume control function using a user input of the source device 500 is supported. The capability exchange and negotiation process of operation 522 will be described in more detail with reference to FIG. 6.

According to various embodiments, in operation 530, the source device 500 may transmit an M5 trigger setup message to the sink device 590. The M5 trigger setup message includes real-time streaming protocol (RTSP) SET_PARAMETER, and may include information for setting up an RTSP session. In operation 532, the sink device 590 may transmit an M5 response.

According to various embodiments, in operation 540, the source device 500 may transmit an M6 request message including an RTSP setup request. In operation 542, the sink device 590 may transmit an M6 response message including an RTSP setup response.

According to various embodiments, in operation 550, the source device 500 may transmit an M7 request message including an RTSP play request. In operation 552, the sink device 590 may transmit an M7 response message including an RTSP play response.

A WFD session between the source device 500 and the sink device 590 may be formed according to M5, M6, and M7 of operations 530 to 552.

According to various embodiments, in operation 560, the source device 500 may start streaming audio and video to the sink device 590.

According to various embodiments, in operation 570, when the source device 500 receives a user input, or in operation 572, when the sink device 590 receives a user input, in operation 574, the source device 500 and/or the sink device 590 may perform a streaming transmission-related operation such as RTSP play and pause.

According to various embodiments, in operation 580, the source device 500 may transmit audio and video streaming to the sink device 590 according to a user input.

According to various embodiments, when the WFD session is terminated by the source device 500 or the sink device 590 in operation 582, the connection between the two devices may be terminated according to the RTSP teardown operation.

Figure 6:
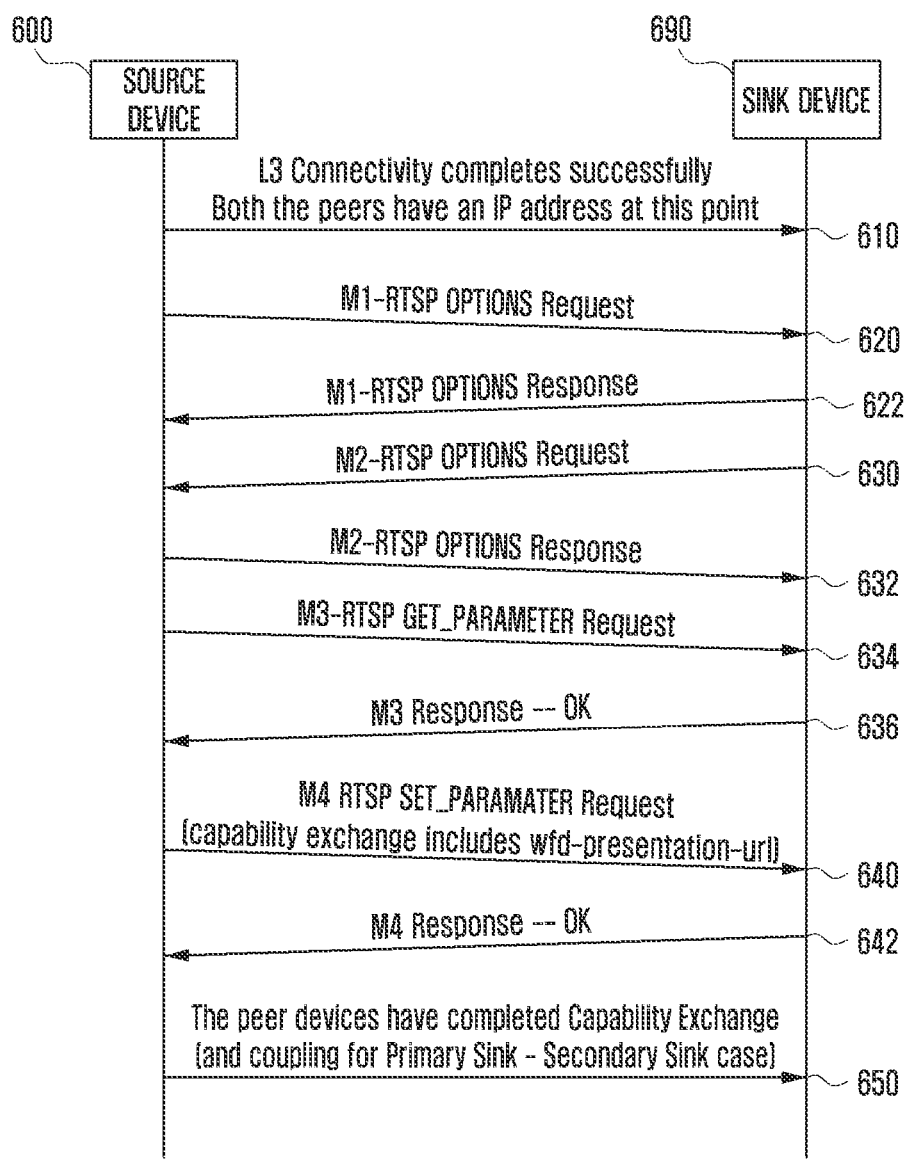
FIG. 6 is a flowchart of a capability exchange and negotiation operation when an electronic device and an external device are mirrored according to an embodiment of the disclosure.

FIG. 6 is a flowchart of a capability exchange and negotiation operation when an electronic device and an external device are mirrored according to an embodiment of the disclosure.

Referring to FIG. 6, a detailed description of the capability exchange and negotiation process of operation 522 of FIG. 5 is illustrated.

Referring to FIG. 6, in operation 610, as the L3 connection is completed, a source device 600 and a sink device 690 may acquire IP addresses of each other.

According to various embodiments, in operation 620, the source device 600 may transmit an M1 request message including an RTSP option request to initiate RTSP procedure and capability negotiation. In operation 622, the sink device 690 may transmit an M1 response message including an RTSP method supported by the sink device 690.

According to various embodiments, in operation 630, the source device 600 may transmit an M2 request message including an RTSP option request, and in operation 632, the sink device 690 may transmit an RTSP option response message.

According to various embodiments, in operation 634, the source device 600 may transmit an M3 request message including RTSP GET_PARAMETER related to capabilities of the sink device 690 required for the source device 600. In operation 636, the sink device 690 may transmit capability information of the sink device 690 as an M3 response message.

According to various embodiments, the source device 600 may request whether the sink device 690 supports volume control through a user input of the source device 600 and volume level information of the sink device 690 through an M3 request. For example, the source device 600 may add WFD_SEC_VOLUME_SUPPORT, WFD_SEC_VOLUME_STATUS, and WFD_SEC_VOLUME_CONTROL_MODE fields to the M3 request and transmit to request the information.

According to various embodiments, through the M3 response, the sink device 690 may transmit whether a volume control function is supported and information about a current volume level and a maximum/minimum volume level of the sink device 690/whether a mute function is supported. For example, as the sink device 690 supports the volume control function, it may respond with WFD_SEC_VOLUME_SUPPORT GET, volume level-related information WFD_SEC_VOLUME_STATUS: 0 100 8 mute, and volume control-related information WFD_SEC_VOLUME_CONTROL_MODE responds with source|sink|dual|sync.

According to various embodiments, in operation 640, the source device 600 may transmit an M4 message including the RTSP SET_PARAMETER together with the message 'WFD_SEC_VOLUME_CONTROL_MODE: sink', which is the selected volume control method, and in operation 642, the sink device 690 may transmit an M4 response message.

According to various embodiments, in operation 650, the source device 600 and the sink device 690 may complete a capability exchange and negotiation process, and start an AV streaming operation.

Figure 7A:
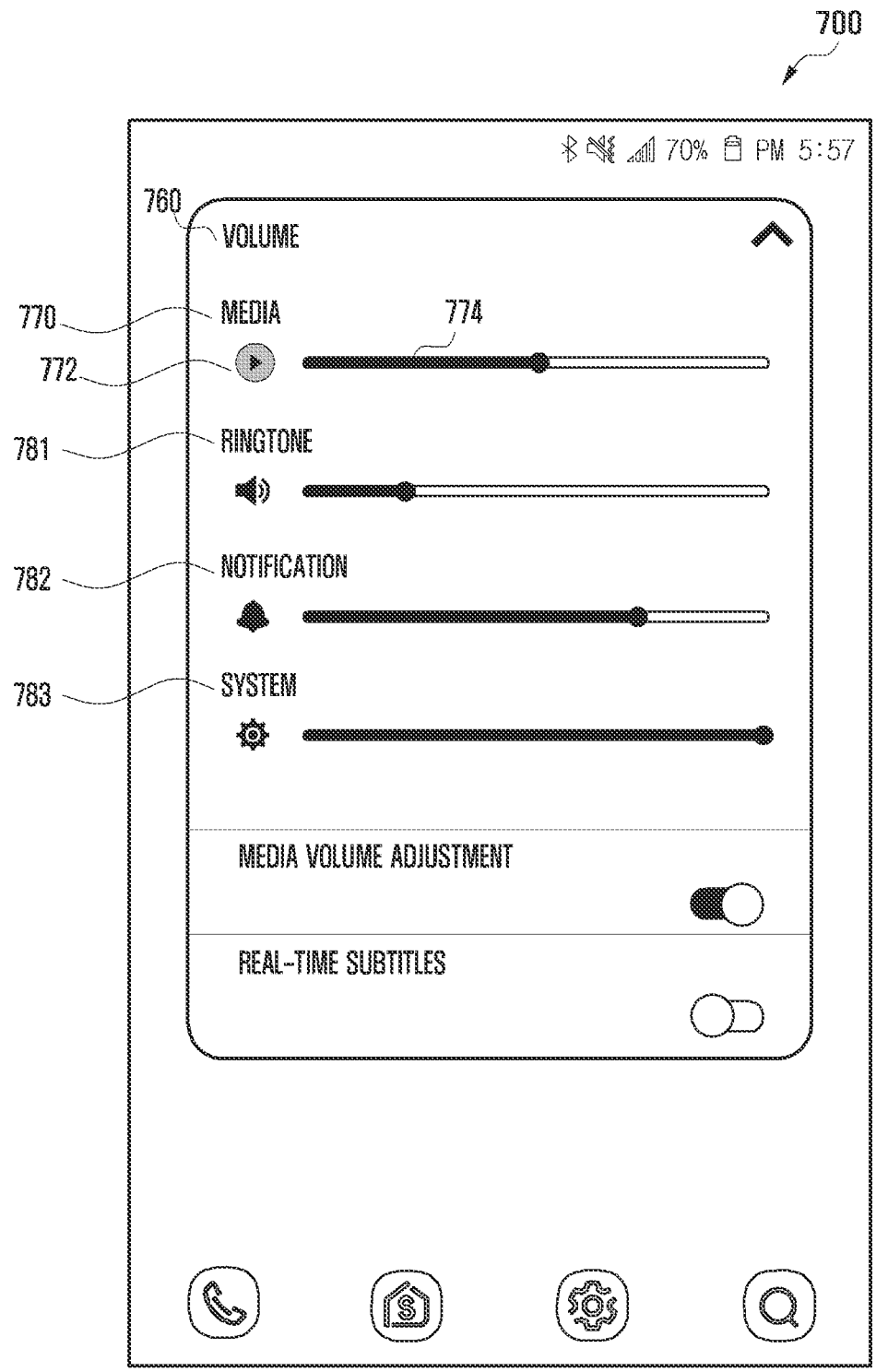
FIGS. 7A and 7B illustrate a volume panel UI of an electronic device according to various embodiments of the disclosure.
Figure 7B:
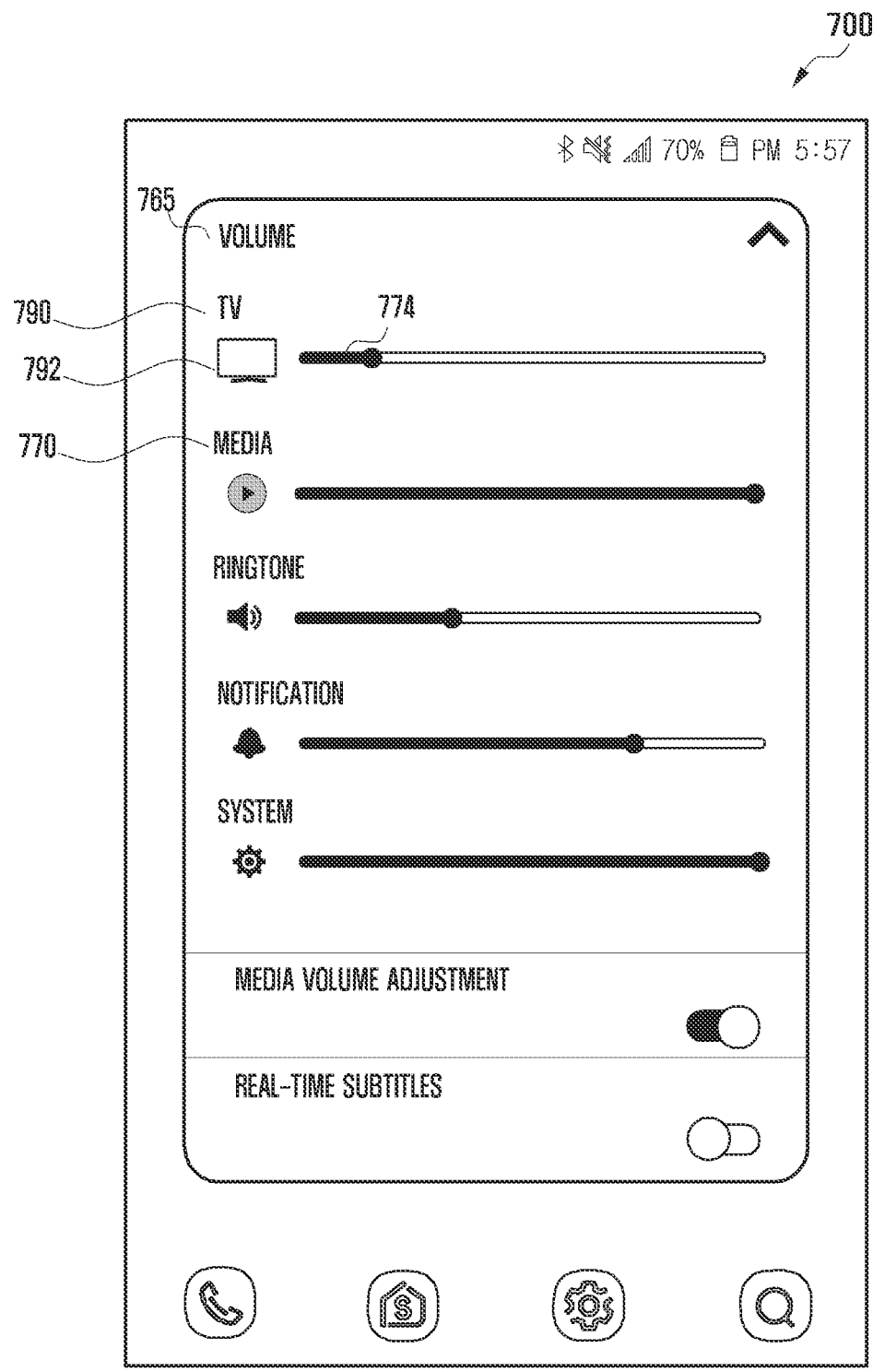

FIGS. 7A and 7B illustrate a volume panel UI of an electronic device according to various embodiments of the disclosure.

According to various embodiments, the processor of the electronic device (e.g., the processor 350 of FIG. 3 or the volume panel component 470 of FIG. 4) may provide a volume panel UI 760 representing volume information on the display.

FIG. 7A illustrates the volume panel UI 760 provided in a state in which the electronic device 700 (e.g., the electronic device 200 of FIG. 2A and the electronic device 300 of FIG. 3) and an external device (e.g., the external device 290a of FIG. 2A) are not connected.

Referring to FIG. 7A, the volume panel UI 760 may display volume bars 770, 781, 782, and 783 for each type of sound. For example, the volume panel UI 760 may include a media volume bar 770, a ringtone volume bar 781, a notification volume bar 782, and a system volume bar 783. The volume bar 770 may include an icon 772 corresponding to each sound type and volume level information 774.

According to various embodiments, the processor is connected to an external device to transmit audio data (e.g., mirroring, Bluetooth audio), and when the external device supports a volume control function, a volume bar 790 for adjusting the volume of the external device may be displayed on a volume panel UI 765.

Referring to FIG. 7B, the volume panel UI 765 may further include a volume bar 790 of an external device, and may include an icon 792 corresponding to the external device and volume level information 774.

According to various embodiments, when the volume is adjusted according to a user input, the volume bar of the actually adjusted device or function may be adjusted on the volume panel UI. For example, when the volume of the electronic device is adjusted according to a user input, the media volume bar may be adjusted, and when the volume of the external device is adjusted, the external device volume bar may be adjusted.

According to various embodiments of the disclosure, when a user adjusts a volume level through a touch input in each volume bar, the electronic device may adjust the volume level accordingly. In this case, when the volume level of the external device is adjusted using the electronic device or a remote control, the volume bar of the external device may also be adjusted, but the volume bar of the external device may not allow volume control on the volume panel UI to prevent the volume of the external device from rapidly increasing.

FIGS. 8A to 8F illustrate changes of a volume panel UI of an electronic device when volume levels of an electronic device and an external device are adjusted according to various embodiments of the disclosure.

According to various embodiments, an electronic device 800 may select at least one device to adjust the volume level from among the electronic device 800 and the external device (e.g., the external device 290a of FIG. 2A) based on a user input for adjusting the volume. For example, the electronic device 800 may check whether the current volume control method is within a specified range of the volume level of the electronic device 800, and determine a volume control target based on this. For example, when a volume increase is input, the electronic device 800 may transmit a volume control signal to an external device through the communication module to increase the volume level of audio data to be transmitted to an external device when the volume level of the electronic device 800 is within the specified range (e.g., less than the first reference value), and increase the volume of the external device when it is not within the specified range (e.g., greater than or equal to the first reference value). The electronic device 800 may display a volume panel UI on the display in response to adjusting the volume level of the electronic device 800 or an external device.

Figure 8A:
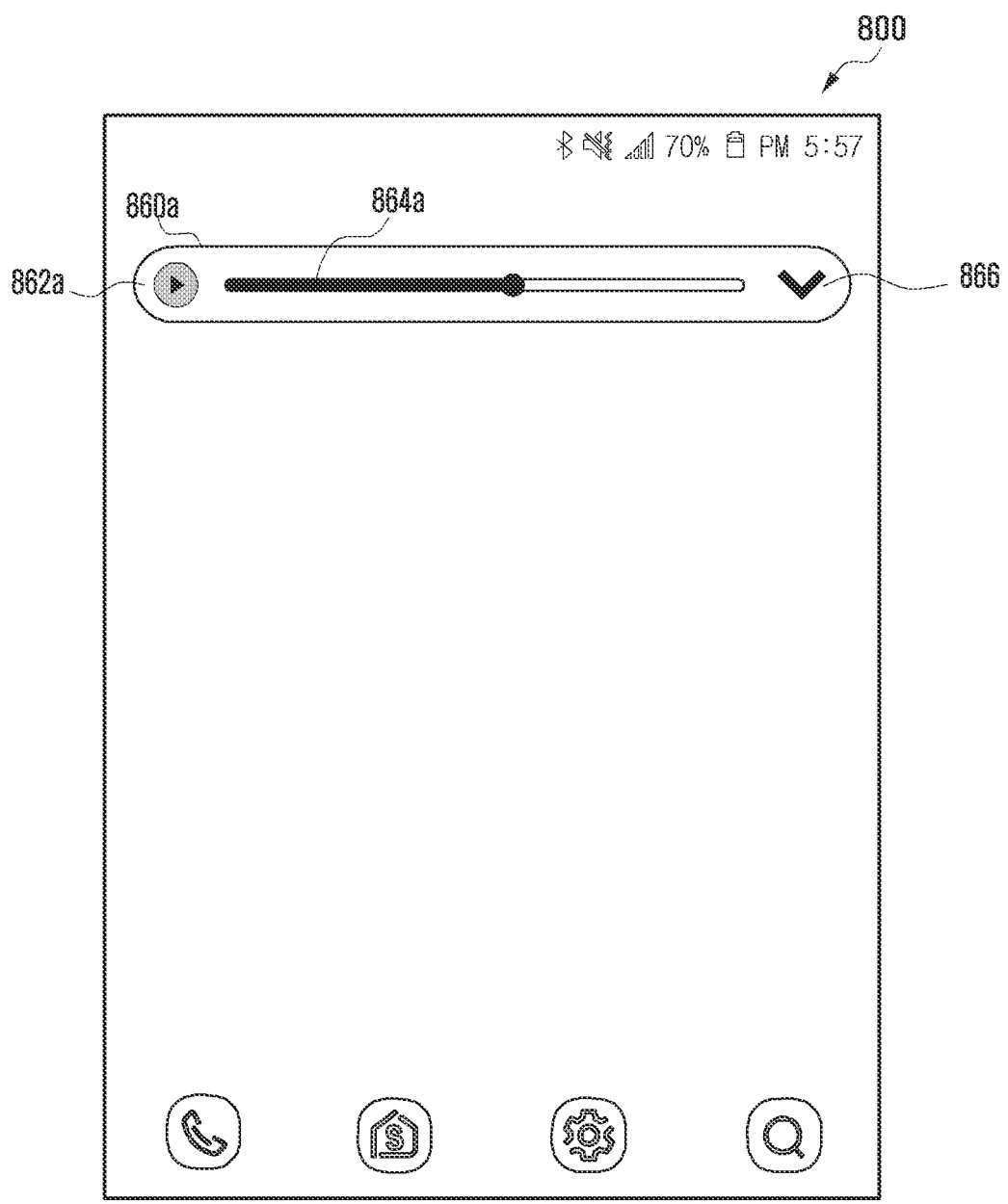
FIGS. 8A, 8B, 8C, 8D, 8E and 8F illustrate changes of a volume panel UI of an electronic device when volume levels of an electronic device and an external device are adjusted according to various embodiments of the disclosure.

Referring to FIG. 8A, when the volume level of the electronic device 800 is increased in response to the user's volume increase input while the volume level of the electronic device 800 is less than the reference value, a volume panel UI 860a including a graphic object (or an icon, target object) 862a corresponding to the media of the electronic device 800 and volume level information (or volume object) 864a of the electronic device 800 may be displayed. When the expand button 866 is pressed on the illustrated volume panel UI 860a, an expanded version of the volume panel UI including a volume bar for each sound type may be displayed, as in the volume panel UI 760 and 765 of FIGS. 7A and 7B.

Figure 8B:
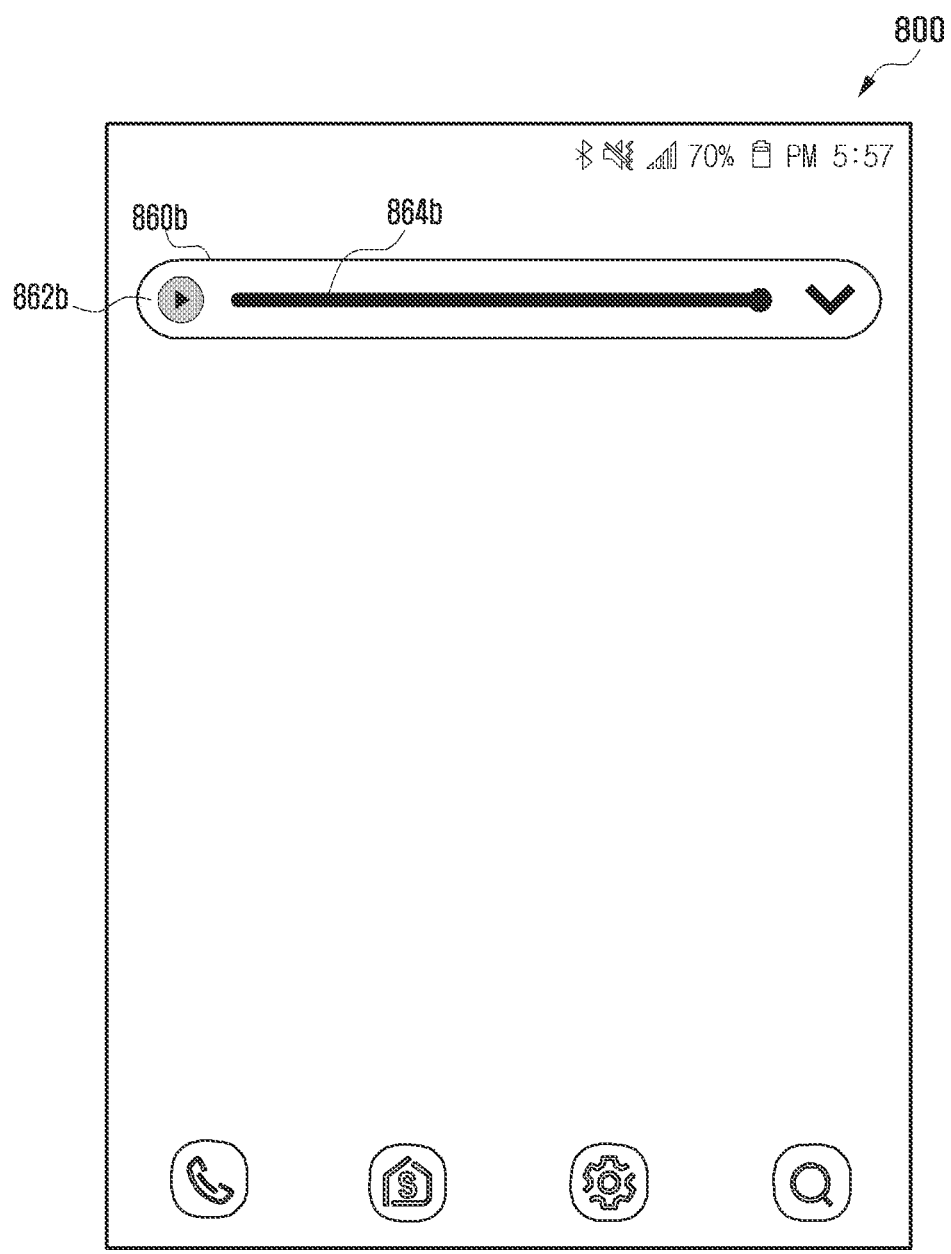

Referring to FIG. 8B, the electronic device 800 may increase the volume level of the electronic device 800 and continue to increase a volume level information 864b of a volume panel UI 860b until the user continues to input the volume increase and the volume level of the electronic device 800 reaches the reference value (e.g., a maximum value). An icon 862b is the same as the icon 862a.

When the volume level of the electronic device 800 reaches the reference value, the electronic device 800 may increase the volume level of the external device in response to a user input received thereafter.

According to an embodiment, in the case of alternately controlling the volume (e.g., alternative), if the electronic device 800 adjusts the volume once, the volume of the electronic device 800 is adjusted, and then, when the volume is adjusted, the volume of the external device may be adjusted. In this way, if the volume control is adjusted one by one alternately, the control target is changed every time, and in this case, the graphic object indicating the device to be volume controlled may be continuously changed. According to another embodiment, the electronic device 800 may display both a graphic object indicating an alternative control method and a volume bar of the volume level of the two devices so that the volume panel UI is not continuously changed.

Figure 8C:
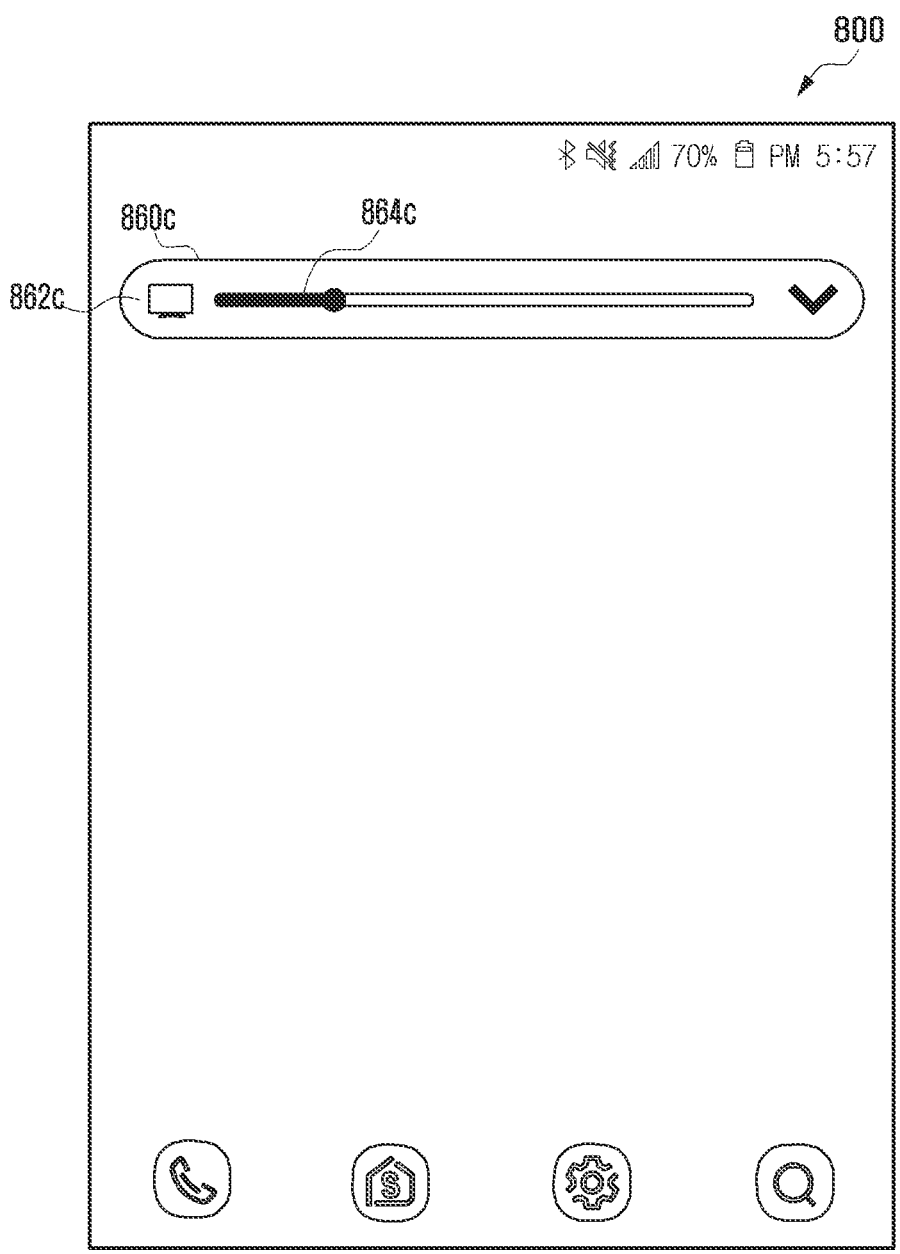

Referring to FIG. 8C, as the control target of the volume level is changed to an external device, a volume panel UI 860c may also be changed to a volume panel UI corresponding to the external device. For example, the changed volume panel UI 860c may include an icon (or target object) 862c corresponding to the external device and a volume level information (or volume object) 864c of the external device.

According to various embodiments, the electronic device may configure a corresponding volume panel UI according to a volume control method.

According to an embodiment, when the volume control method is a method of controlling only the electronic device even if the external device supports volume control, the electronic device may adjust only the volume level of the electronic device according to a user input.

Figure 8D:
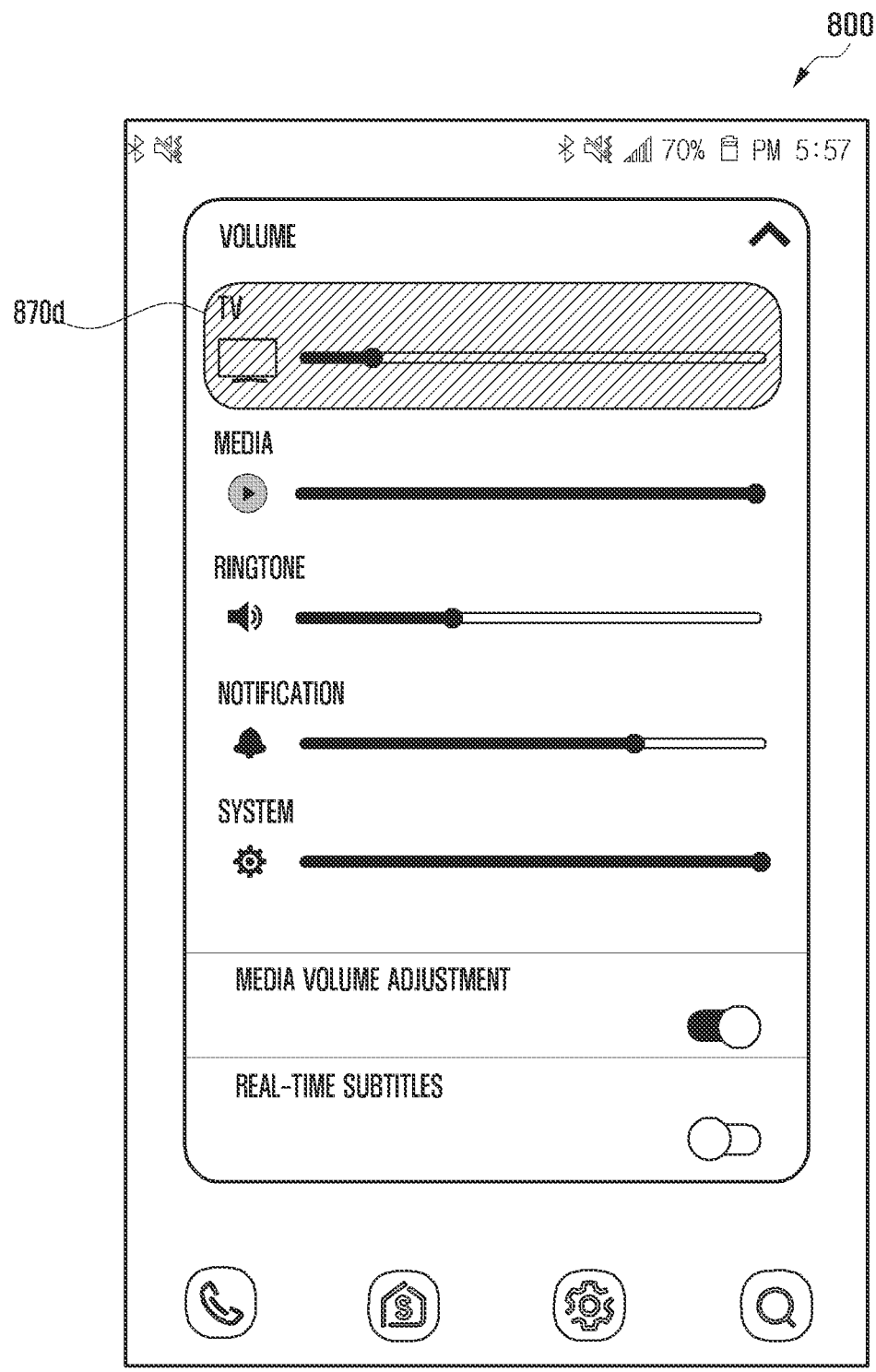

Referring to FIG. 8D, the volume panel UI may display volume information of the connected external device, but a volume information 870d of the external device may be dim-processed so that the user knows that the volume of the external device cannot be controlled.

According to an embodiment, when the volume control method controls only the external device, the electronic device may adjust only the volume level of the external device according to a user input.

Figure 8E:
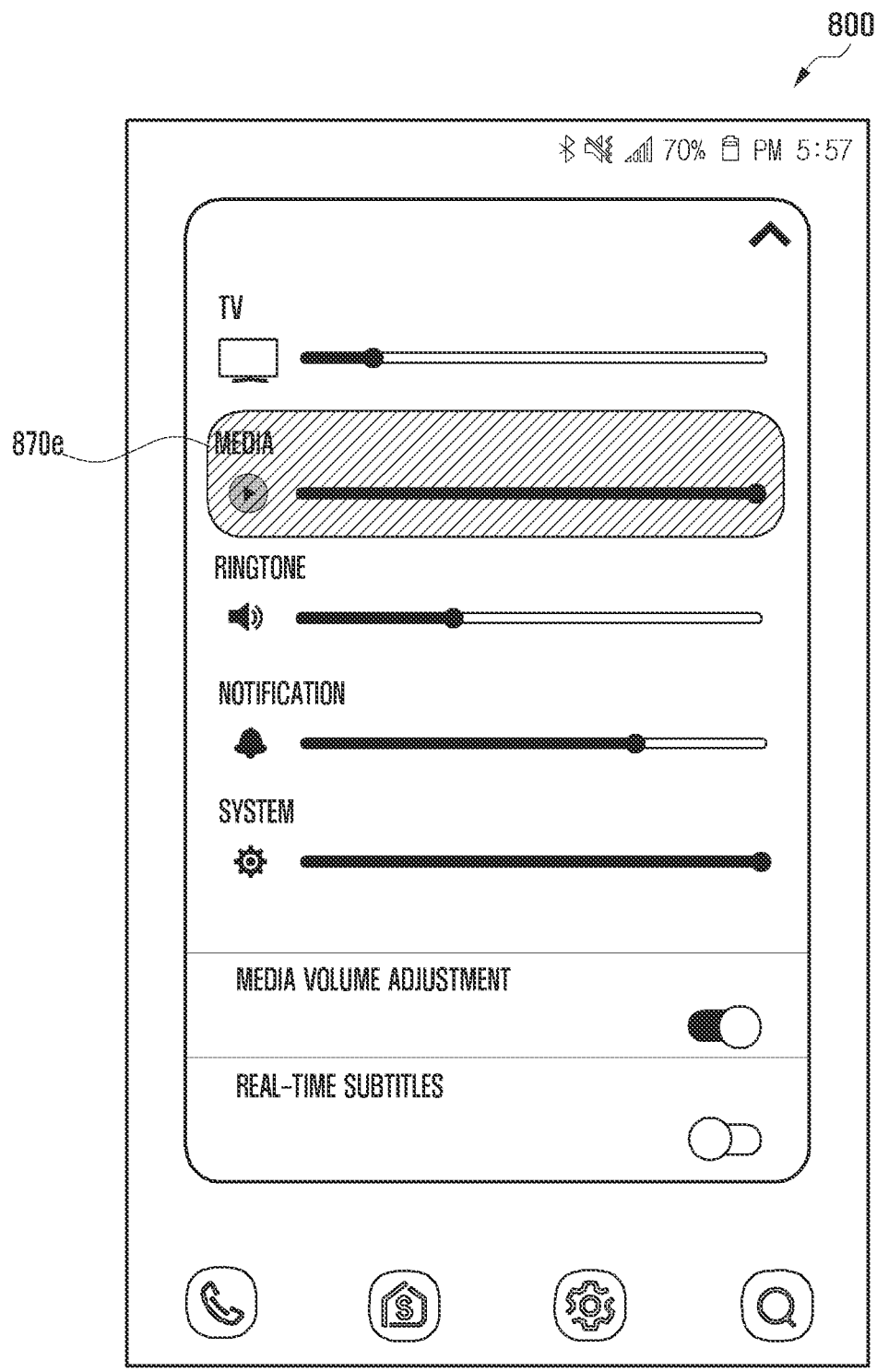

Referring to FIG. 8E, the volume panel UI may display volume information of the electronic device, but a volume information 870e of the electronic device may be dim-processed so that the user knows that the volume of the electronic device cannot be controlled.

Figure 8F:
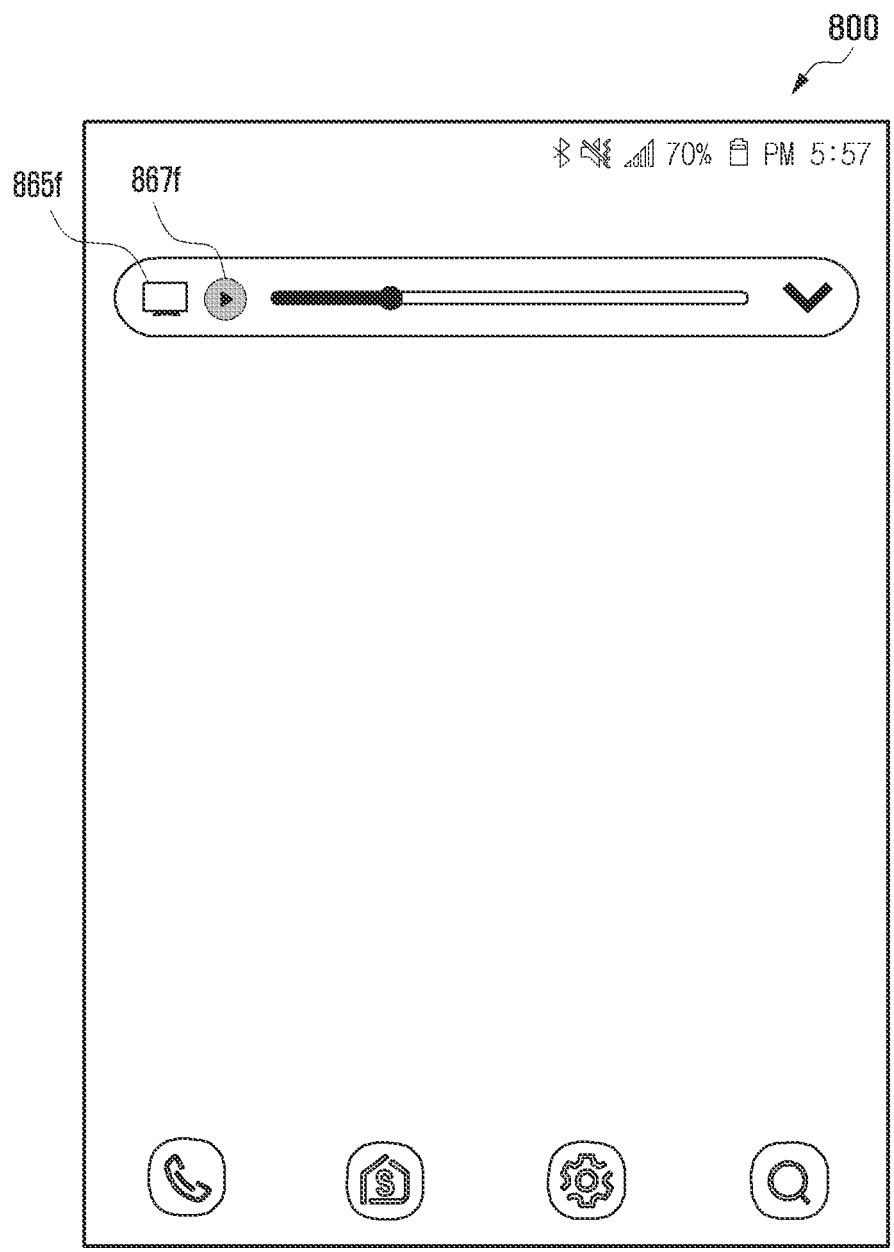

Referring to FIG. 8F, when the determined volume control method is a control method in which the volume levels of the electronic device and the external device are synchronized and operated, the volume levels of the two devices may be simultaneously adjusted based on a user input. In this case, by simultaneously controlling the volume of the electronic device and the external device, a graphic object 865f indicating the electronic device and a graphic object 867f indicating the external device are simultaneously displayed on the volume UI so that the user can recognize the operation thereof.

Also, since the synchronization method follows the volume level of the electronic device, it has the same steps as the volume control of the existing electronic device and controls the volume.

Figure 9:
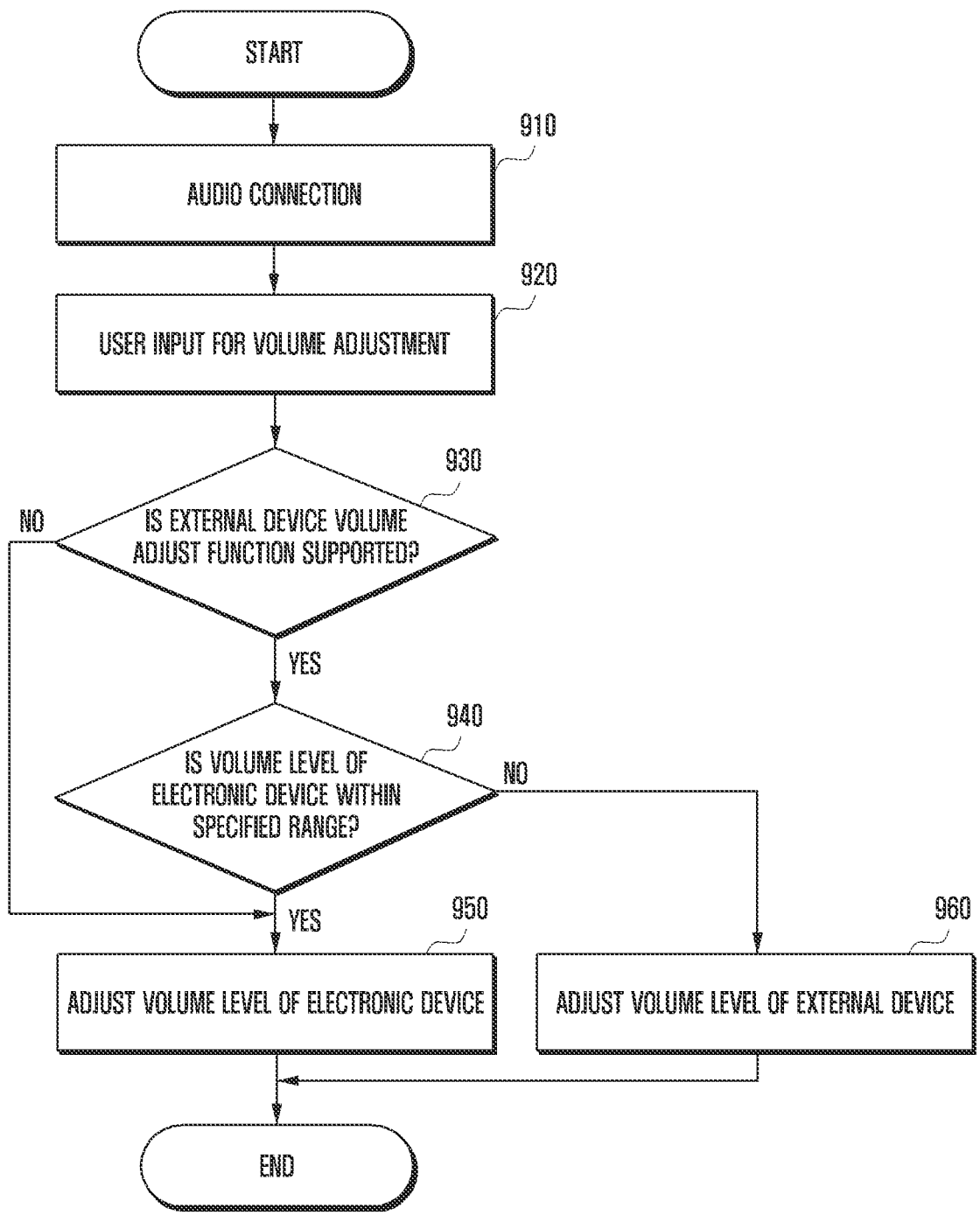
FIG. 9 is a flowchart illustrating a method of controlling an audio volume of an electronic device according to an embodiment of the disclosure.

FIG. 9 is a flowchart illustrating a method of controlling an audio volume of an electronic device according to an embodiment of the disclosure.

The illustrated method may be performed by the electronic device (e.g., the electronic device 300 of FIG. 3) described with reference to FIGS. 1 to 8F, and a description of the technical features described above will be omitted below.

Referring to FIG. 9, in operation 910, the electronic device may establish a wireless communication connection for transmission of audio data with the external device through a communication module (e.g., the communication module 330 of FIG. 3). For example, when the electronic device is connected to the external device, which is a TV through the mirroring function (e.g., FIG. 2A), the electronic device may establish a Wi-Fi Direct connection with the external device, and when the electronic device is connected to the external device, which is earbuds (e.g., FIG. 2B), the electronic device may establish a Bluetooth connection with the external device.

According to various embodiments, in operation 920, the electronic device may receive a user input for volume adjustment. For example, the electronic device may receive a user input on a key input unit (e.g., the key input unit 320 of FIG. 3), and may receive a user input on a second external device (e.g., a wearable device) connected to the electronic device as a user input for volume control. According to an embodiment, the electronic device may not process the volume control input on the volume panel UI as a user input in operation 920.

According to various embodiments, in operation 930, the electronic device may check whether the external device supports a volume control function through a user input on the electronic device. For example, the electronic device and the external device may perform a capability exchange and negotiation operation during a mirroring session connection process, and may transmit and receive information on whether or not volume control is supported on a message (e.g., M3 (RTSP GET_PARAMETER request) and M3 response) transmitted and received during a capability exchange and negotiation operation. If the external device does not support the volume control function, in operation 950, the electronic device may adjust the volume level of the electronic device in response to a user input.

According to various embodiments, when the external device supports the volume control function, in operation 940, the electronic device may check whether the volume level of the electronic device is within a specified range. The reference value may be the maximum value of a volume level supported by the electronic device or a value designated such as 90% of the maximum value.

According to various embodiments, when the volume level of the electronic device is within a specified range (e.g., is less than the maximum value), in operation 950, the electronic device may adjust the volume level of the electronic device. The electronic device may display or update the volume panel UI (e.g., the volume panel UI of FIG. 8A) as the volume level of the electronic device increases.

According to various embodiments, when the volume level of the electronic device is not within a specified range (e.g., reaches the maximum value), in operation 960, the electronic device may adjust the volume level of the external device. The electronic device may transmit a volume control signal to the external device to increase the volume level of the external device, and change the volume panel UI (e.g., the volume panel UI in FIG. 8C) to an icon indicating the external device and a volume level of the external device.

Figure 10:
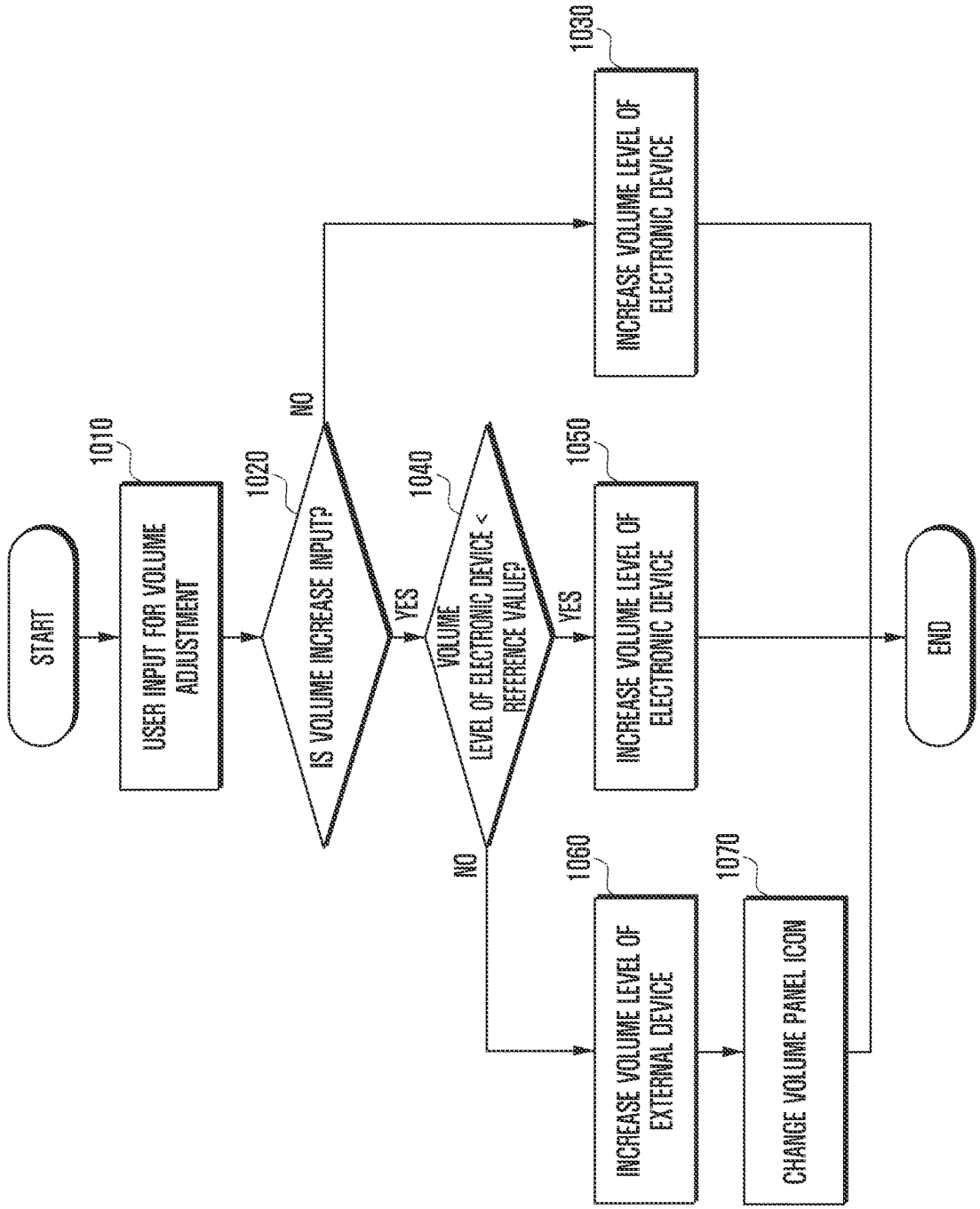
FIG. 10 is a flowchart of a method of controlling an audio volume of an electronic device according to an embodiment of the disclosure.

FIG. 10 is a flowchart of a method of controlling an audio volume of an electronic device according to an embodiment of the disclosure.

The illustrated method may be performed by the electronic device (e.g., the electronic device 300 of FIG. 3) described with reference to FIGS. 1 to 8F, and a description of the technical features described above will be omitted below.

Referring to FIG. 10, in operation 1010, the electronic device may receive a user input for volume control while being connected to an external device and outputting audio data.

According to various embodiments, as a result of checking in operation 1020, when the user input is a volume decrease, in operation 1030, the electronic device may increase the volume level of the external device.

According to various embodiments, as a result of checking in operation 1020, when the user input is a volume increase, in operation 1040, the electronic device may check whether the volume level of the electronic device is less than a reference value. The reference value may be a maximum value of a volume level supported by the electronic device or a value designated such as 90% of the maximum value.

According to various embodiments, when the volume level of the electronic device is less than the reference value, in operation 1050, the electronic device may increase the volume level of the electronic device in response to a user input.

According to various embodiments, when the volume level of the electronic device reaches the reference value, in operation 1060, the electronic device may increase the volume level of the external device. The electronic device transmits a volume control signal to the external device to increase the volume level of the external device, and in operation 1070, the electronic device may change the volume panel UI (e.g., the volume panel UI of FIG. 8C) to an icon indicating the external device and a volume level of the external device.

FIG. 11 is a flowchart of a method of controlling an audio volume of an electronic device according to an embodiment of the disclosure.

The illustrated method may be performed by the electronic device (e.g., the electronic device 300 of FIG. 3) described with reference to FIGS. 1 to 8F, and a description of the technical features described above will be omitted below.

Referring to FIG. 11, in operation 1111, the electronic device may be connected to the external device through wireless communication (e.g., Wi-Fi Direct and Bluetooth). The electronic device may transmit audio data to the external device through a wireless connection, and the audio data may be output on the external device.

According to various embodiments, in operation 1112, the electronic device may receive a user input for adjusting a volume while outputting audio through the external device.

According to various embodiments, in operation 1113, the electronic device may check whether the external device supports a volume control function through a user input on the electronic device. For example, the electronic device and the external device may perform a capability exchange and negotiation operation during a mirroring session connection process, and may transmit and receive information on whether or not volume control is supported on a message (e.g., M3 (RTSP GET_PARAMETER request) and M3 response) transmitted and received during a capability exchange and negotiation operation.

According to various embodiments, when the external device does not support the volume control function, in operation 1160, the electronic device may adjust the volume level of the electronic device in response to a user input, and in operation 1165, the volume level of the electronic device in the volume panel UI may be updated.

According to various embodiments, when the external device supports a volume control function, the electronic device may check whether a condition of the determined volume control method is satisfied in operation 1114. The volume control method may include source, sink, dual, sync, and alternate described above. Also, the condition of the volume control method may be determined by at least one of a volume level of the electronic device and/or the external device, an audio operation mode, and a user's setting. For example, the electronic device may adjust the volume level of the electronic device or the external device according to whether the volume level of the electronic device is within a specified range.

According to various embodiments, in operation 1115, the electronic device may determine whether the volume control method is a method of synchronizing and controlling the volume levels of the electronic device and the external device. For example, it is possible to check whether the volume control method described above is dual or sync.

According to various embodiments, if the determined volume control method is a method of synchronizing and controlling volume levels of the electronic device and the external device, in operation 1170, the electronic device may adjust both the volume level of the electronic device and the volume level of the external device. Also, in operation 1175, the electronic device may display graphic objects of the electronic device and the external device on the volume panel UI, and may update each volume level.

According to various embodiments, if the determined volume control method is not a method of synchronizing and controlling the volume levels of the electronic device and the external device, in operation 1180, the electronic device may adjust the volume level of the external device, and in operation 1185, the volume panel UI may change and update the graphic object and volume information indicating the electronic device to the graphic object and volume information indicating the external device.

An electronic device according to various embodiments may include a display, a communication module, and a processor operatively connected to the display and the communication module, wherein the processor may be configured to: transmit audio data to an external device through the communication module; receive a user input for volume adjustment; check whether the volume level set in the electronic device is within a specified range; select at least one device, based on a result of the result, to adjust a volume level from the electronic device and the external device in response to the user input; display a volume panel UI including volume information and a graphic object indicating the selected one of the electronic device or the external device on the display in case of changing the volume level of the selected one of the electronic device or the external device; and change the graphic object and volume information indicating the selected one of the electronic device or the external device displayed on the volume panel UI to a graphic object and volume information indicating the other of the electronic device or the external device in case of changing the volume level of the other of the electronic device or the external device according to a user input while displaying the volume panel UI.

According to various embodiments, the processor may be configured to: adjust the volume level of the electronic device in response to the user input in case that the volume level of the electronic device is within the specified range; and transmit a volume control signal to the external device to adjust the volume of the external device in case that the volume level of the electronic device is not within the specified range.

According to various embodiments, the processor may be configured to be connected to the external device through a Wi-Fi direct (WFD) through the communication module to mirror the image data and the audio data to the external device.

According to various embodiments, the processor may be configured to check whether the external device supports a volume control function based on a user input on the electronic device during the process of establishing WFD connection with the external device.

According to various embodiments, the processor may be configured to select a device to adjust the volume level from the electronic device and the external device in response to the user input in case that the external device supports the volume control function; or adjust the volume level of the electronic device in response to the user input in case that the external device does not support the volume control function.

According to various embodiments, the processor may be configured to change both the volume level of the electronic device and the volume level of the external device, based on the user input in case that the volume level of the electronic device and the volume level of the external device are the same.

According to various embodiments, the electronic device may further include a key input unit provided outside the housing of the electronic device, wherein the user input for adjusting the volume may be an input on the key input unit.

According to various embodiments, the specified range may include a range less than a reference value for a volume level of the electronic device, and the processor may be configured to adjust the volume level of the electronic device when the volume level of the electronic device is less than the reference value, and adjust the volume level of the external device when the volume level of the electronic device reaches the reference value in response to a user input for increasing the volume.

According to various embodiments, the processor may be configured to distinguish and display visually a graphic object and a volume level indicating a device for which volume adjustment is not performed according to the user input on the volume panel UI.

According to various embodiments, the processor may be configured to select at least one of the electronic device and the external device to adjust the volume level further based on at least one of an audio output mode and a user's setting.

According to various embodiments, the processor may be configured to adjust the volume level of the electronic device in response to the user input in case that the audio output mode is a mode in which audio data is not output by the external device.

A volume control method of an electronic device according to various embodiments may include transmitting audio data to an external device connected via wireless communication; receiving user input for volume adjustment; checking whether the volume level set in the electronic device is within the specified range; selecting at least one of the electronic device and the external device to adjust the volume level in response to the user input based on the checking result; displaying a volume panel UI including volume information and a graphic object indicating a selected one of the electronic device or the external device on the display in case of changing the volume level of the selected one of the electronic device or the external device; and changing the graphic object and volume information indicating the selected one of the electronic device or the external device displayed on the volume panel UI to a graphic object and volume information indicating the other of the electronic device or the external device in case of changing the volume level of the other of the electronic device or the external device according to a user input while displaying the volume panel UI.

According to various embodiments, the method may further includes: adjusting the volume level of the electronic device in response to the user input when the volume level of the electronic device is within the specified range; or transmitting the volume control signal to the external device to adjust the volume of the external device when the volume level of the electronic device is not within the specified range.

According to various embodiments, the transmitting the audio data may include mirroring the audio data to the external device by being connected to the external device through the WFD (Wi-Fi direct), and the method may further include checking whether the external device supports a volume control function, based on a user input on the electronic device in the process of establishing WFD connection with the external device.

According to various embodiments, the selecting at least one device to adjust the volume level may include selecting at least one of the electronic device and the external device to adjust the volume level, further based on at least one of an audio output mode and a user's setting.

According to various embodiments, the specified range includes a range less than a reference value for a volume level of the electronic device, and the selecting at least one device to adjust the volume level may include: adjusting the volume level of the electronic device when the volume level of the electronic device is less than the reference value; and adjusting the volume level of the external device when the volume level of the electronic device reaches the reference value in response to a user input for increasing the volume.

According to various embodiments, the method may further include distinguishing and displaying visually a graphic object and a volume level indicating a device for which volume adjustment is not performed according to the user input on the volume panel UI.

An electronic device according to various embodiments may include a display, a communication module, and a processor operatively connected to the display and the communication module, wherein the processor may be configured to: establish a WFD (Wi-Fi Direct) connection with an external device through the communication module; transmit audio data to the external device through the WFD connection; receive a user input for increasing the volume while the audio data is output by the external device; check the volume level set in the electronic device; increase the volume level of the electronic device in response to the user input in case that the volume level of the electronic device is less than the reference value; display a volume panel UI including a graphic object indicating the electronic device and volume information of the electronic device, in response to an increase in the volume level of the electronic device; change the graphic object indicating the electronic device and volume information of the electronic device of the volume panel UI to a graphic object indicating the external device and volume information of the external device in case that the volume level of the electronic device increases above a reference value; and increase the volume level of the external device in response to the user input.

According to various embodiments, the processor may be configured to check whether the external device supports a volume control function based on a user input on the electronic device during the process of establishing WFD connection with the external device.

According to various embodiments, the processor may be configured to check the volume level set in the electronic device and adjust the volume level of the electronic device or the external device when the audio output mode and the user's setting satisfy a specified condition.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a display;
communication circuitry; and
a processor operatively connected to the display and the communication circuitry,
wherein the processor is configured to:
transmit audio data to an external device through the communication circuitry,
receive a user input for adjusting a volume level of an audio output associated with the audio data through the external device,
in response to the user input, check whether a first volume level being set in the electronic device is within a specified range,
based on whether the first volume level being set in the electronic device is within the specified range, select one of the first volume level of the electronic device or a second volume level of the external device to be adjusted corresponding to the user input,
when the first volume level is within the specified range, adjust the first volume level corresponding to the user input and display a first UI comprising at least a first volume object indicating the first volume level and a first graphic icon indicating the electronic device, and
when the first volume level is increased to a threshold of the specified range, change display of the first UI to display of a second UI comprising at least a second volume object indicating the second volume level and a second graphic icon indicating the external device, and adjust the second volume level corresponding to the user input.

2. The electronic device of claim 1, wherein the processor is further configured to:
when the volume level to be adjusted in response to the user input is changed from the first volume level to the second volume level, while displaying the first UI, change the first UI to the second UI.

3. The electronic device of claim 1, wherein the processor is further configured to:
adjust the first volume level of the electronic device in response to the user input, when the first volume level of the electronic device is within the specified range, and
transmit a volume control signal to the external device to adjust the second volume level of the external device, when the first volume level of the electronic device is not within the specified range.

4. The electronic device of claim 1, wherein the processor is further configured to connect to the external device through a Wi-Fi direct (WFD) through the communication circuitry to mirror image data and the audio data to the external device.

5. The electronic device of claim 4, wherein the processor is further configured to check whether the external device supports a volume control function based on a user input on the electronic device during a process of establishing a WFD connection with the external device.

6. The electronic device of claim 5, wherein the processor is further configured to:
select one of the first volume level or the second volume level in response to the user input, when the external device supports the volume control function, or
adjust the first volume level in response to the user input, when the external device does not support the volume control function.

7. The electronic device of claim 1, wherein the processor is further configured to adjust both the first volume level and the second volume level, based on the user input, when the first volume level and the second volume level are the same.

8. The electronic device of claim 1, further comprising:
a key input unit provided outside a housing of the electronic device,
wherein the user input for adjusting the volume level of the audio output is an input on the key input unit.

9. The electronic device of claim 1,
wherein the specified range comprises a range less than a reference value for the first volume level of the electronic device, and
wherein the processor is further configured to:
adjust the first volume level when the first volume level is less than the reference value, and
adjust the second volume level when the first volume level reaches the reference value, in response to a user input for increasing the volume level.

10. The electronic device of claim 1, wherein the processor is further configured to display the first UI with a first graphic effect different from a second graphic effect of the second UI, while the first volume level is adjusted.

11. The electronic device of claim 1, wherein the processor is further configured to select one of the first volume level or the second volume level further, based on at least one of an audio output mode and a user's setting.

12. The electronic device of claim 11, wherein the processor is further configured to adjust the first volume level in response to the user input when the audio output mode is a mode in which audio data is not output by the external device.

13. A method of controlling a volume of an electronic device, comprising;
transmitting audio data to an external device connected via wireless communication;
receiving a user input for adjusting a volume level of an audio output associated with the audio data through the external device;
in response to the user input, checking whether a first volume level being set in the electronic device is within a specified range;
based on whether the first volume level being set in the electronic device is within the specified range, selecting one of the first volume level of the electronic device or a second volume level of the external device to be adjusted corresponding to the user input;
when the first volume level is within the specified range, adjusting the first volume level corresponding to the user input and displaying a first UI comprising at least a first volume object indicating the first volume level and a first graphic icon indicating the electronic device; and
when the first volume level is increased to a threshold of the specified range, changing display of the first UE to display of a second UI comprising at least a second volume object indicating the second volume level and a second graphic icon indicating the external device, and adjusting the second volume level corresponding to the user input.

14. The method of claim 13, further comprising:
when the volume level to be adjusted in response to the user input is changed from the first volume level to the second volume level, while displaying the first UI, changing the first UI to the second UI.

15. The method of claim 13, further comprising:
adjusting the first volume level of the electronic device in response to the user input when the volume level of the electronic device is within the specified range; or
transmitting a volume control signal to the external device to adjust the second volume level of the external device when the volume first level of the electronic device is not within the specified range.

16. The method of claim 13,
wherein the transmitting the audio data comprises mirroring the audio data to the external device by being connected to the external device through Wi-Fi direct (WFD), and
wherein the method further comprises checking whether the external device supports a volume control function, based on another user input on the electronic device in a process of establishing a WFD connection with the external device.

17. The method of claim 13, wherein the selecting one of the first volume level or the second volume level comprises selecting one of the first volume level or the second volume level, further based on at least one of an audio output mode and a user's setting.

18. The method of claim 13,
wherein the specified range comprises a range less than a reference value for the first volume level of the electronic device, and
wherein the selecting one of the first volume level or the second volume level comprises:
selecting the first volume level, when first the volume level is less than the reference value; or
selecting the second volume level of the external device when the first volume level reaches the reference value, in response to a user input for increasing the volume.

19. An electronic device comprising:
a display;
communication circuitry; and
a processor operatively connected to the display and the communication circuitry,
wherein the processor is configured to:
establish a Wi-Fi Direct (WFD) connection with an external device through the communication circuitry,
transmit audio data to the external device through the WFD connection;
receive a user input for increasing a volume level of an audio output through the external device, while audio is output by the external device,
check a first volume level being set in the electronic device;
increase the first volume level of the electronic device in response to the user input, when the first volume level of the electronic device is less than a reference value,
display a volume panel UI comprising a graphic object indicating the electronic device and the first volume level of the electronic device, in response to an increase in the first volume level of the electronic device,
change the graphic object indicating the electronic device and the first volume level of the electronic device to a graphic object indicating the external device and a second volume level of the external device, when the first volume level increases above a reference value; and
increase the second volume level of the external device in response to the user input.

20. The electronic device of claim 19, wherein the processor is further configured to check whether the external device supports a volume control function based on another user input on the electronic device during a process of establishing a WFD connection with the external device.

* * * * *